United States Patent
Jin

(10) Patent No.: US 12,520,575 B2
(45) Date of Patent: Jan. 6, 2026

(54) TUNABLE RESONATOR

(71) Applicant: Taiwan Semiconductor Manufacturing Company, Ltd., Hsinchu (TW)

(72) Inventor: Jun-De Jin, Hsinchu (TW)

(73) Assignee: Taiwan Semiconductor Manufacturing Company, LTD, Hsinchu (TW)

( * ) Notice: Subject to any disclaimer, the term of this patent is extended or adjusted under 35 U.S.C. 154(b) by 993 days.

(21) Appl. No.: 17/586,471

(22) Filed: Jan. 27, 2022

(65) Prior Publication Data
US 2023/0030906 A1 Feb. 2, 2023

Related U.S. Application Data

(60) Provisional application No. 63/227,194, filed on Jul. 29, 2021.

(51) Int. Cl.
*H03H 11/24* (2006.01)
*H10D 30/01* (2025.01)
*H10D 30/62* (2025.01)
*H10D 84/85* (2025.01)

(52) U.S. Cl.
CPC ......... *H10D 84/853* (2025.01); *H03H 11/245* (2013.01); *H10D 30/0243* (2025.01); *H10D 30/6211* (2025.01)

(58) Field of Classification Search
CPC .. H03H 11/245; H03H 9/2405; H03H 9/2426; H03H 2009/02314; H03H 9/02259; H03H 9/05; H03H 9/14544; H03H 9/02275; H03H 2009/02299; H01L 27/0924; H01L 29/6681; H01L 28/785; H01L 29/7851
See application file for complete search history.

(56) References Cited

U.S. PATENT DOCUMENTS

| | | | |
|---|---|---|---|
| 9,294,035 B2 | 3/2016 | Manipatruni et al. | |
| 9,663,346 B1 | 5/2017 | Bahr et al. | |
| 9,818,648 B2 | 11/2017 | Chao et al. | |
| 9,899,363 B1* | 2/2018 | Bahr | H01L 23/53214 |
| 9,929,156 B2* | 3/2018 | Oh | H01L 27/0886 |

(Continued)

OTHER PUBLICATIONS

Bahr et al., "32GHz Resonant-Fin Transistors in 14nm FinFET Technology," ISSCC 2018 Session 21 Extending Silicon and its Applications 21.3, IEEE International Solid-State Circuits Conference, pp. 348-349 (Feb. 14, 2018).

(Continued)

*Primary Examiner* — Andrea Lindgren Baltzell
*Assistant Examiner* — Kimberly E Glenn
(74) *Attorney, Agent, or Firm* — Merchant & Gould P.C.

(57) ABSTRACT

A resonator device includes a substrate with a first number of fins extending over the substrate. The fins extend along the substrate in a first direction. A second number of conductive fingers are provided over the fins, which extend in a second direction perpendicular to the first direction. The first number is less than or equal to the second number. The conductive fingers are configured to receive an input signal such that the conductive fingers resonate at an output frequency. The conductive fingers define a finger pitch therebetween, and the output frequency is based on the finger pitch.

20 Claims, 25 Drawing Sheets

(56) References Cited

U.S. PATENT DOCUMENTS

| | | | |
|---|---|---|---|
| 11,201,151 B2* | 12/2021 | Hudeczek | H01L 29/0673 |
| 2014/0292429 A1* | 10/2014 | Manipatruni | H03B 5/30 |
| | | | 331/108 C |
| 2017/0140992 A1* | 5/2017 | Chang | H01L 21/0332 |

OTHER PUBLICATIONS

Weinstein et al., "The Resonant Body Transistor," NANO Letters, DOI: 10.1021/nl9037517, vol. 10, pp. 1234-1237 (2010).

* cited by examiner

TUNABLE RESONATOR

BACKGROUND

Electronic circuits typically include a clock circuit. Such clock circuits may provide one or more timing signals to the electronic circuit. The clock circuit is generally implemented via an integrated circuit and in certain examples may utilize complementary metal-oxide-semiconductor (CMOS) technology. Clock circuits generally include an oscillator and a resonator. An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (i.e., naturally oscillates at resonant frequencies with greater amplitude than at other non-resonant frequencies).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
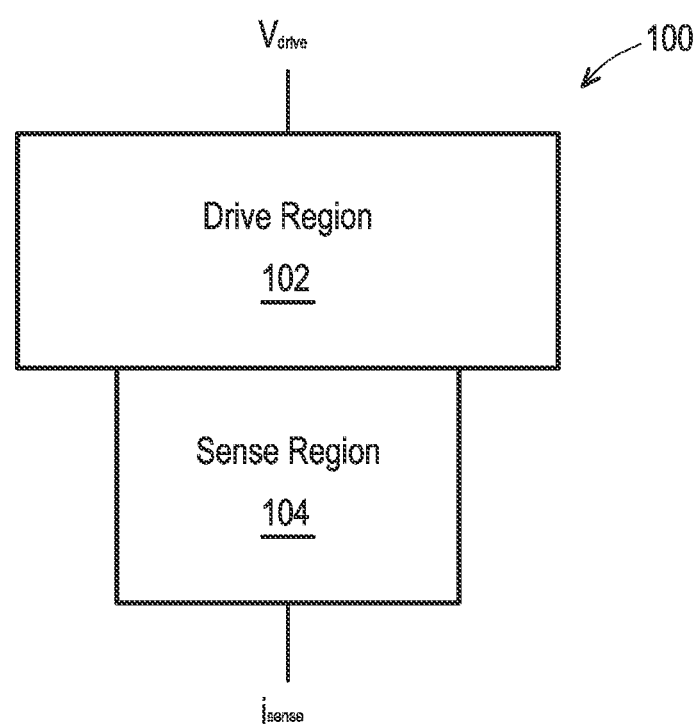
FIG. 1 is a block diagram illustrating an example of a resonator device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A clock circuit is a basic building block many electronic circuits, including high-speed and radio frequency (RF) integrated circuits (ICs). Such clock circuits provide one or more timing signals to the associated circuits. Clock circuits generally include an oscillator and a resonator. An oscillator may include an electric circuit that produces a periodically varying output at a controlled frequency. Filters may be implemented in circuits that selectively pass certain elements of a signal while eliminating other elements of the signal. A resonator may include circuitry or structure that exhibits resonant behavior (i.e., naturally oscillates at resonant frequencies with greater amplitude than at other non-resonant frequencies). Oscillators, filters, resonators and the like may use quartz crystal, inductors, and/or capacitors to generate or promote certain signal frequencies. In ICs, a high frequency clock may be generated by an off-chip crystal together with an on-chip frequency doubler, an on-chip LC oscillator, an on-chip ring oscillator, and the like. For such clock circuits, improvements in parameters such as power reduction, improved performance, and reduced chip area are desired.

Clock circuits may be implemented using complementary metal-oxide-semiconductor (CMOS) technology. With certain oscillator circuits implemented using CMOS technology, frequency tuning is unavailable. For example, a fin field-effect transistor (FinFET) is a multigate device—a MOSFET (metal-oxide-semiconductor field-effect transistor) built on a substrate where the gate is placed on two, three, or four sides of the channel or wrapped around the channel. The source/drain (S/D) regions of these transistors are formed by fins on or over the substrate surface. Some known CMOS resonator devices employ resonant body transistor structures, though the frequency of such devices is not tunable. Others use the semiconductor fins of FinFET transistors to form a mechanical resonator structure. In these devices, the fin pitch determines the resonator frequency. Since the fin pitch is not variable in such CMOS resonator structures, they do not provide tunable output frequency.

However, in some circuit implementations, it may be desirable for the frequency output of clock circuits to be tunable. Some disclosed examples provide a resonator structure based on CMOS structures using standard CMOS technology, such as a CMOS transistor structure. Some disclosed embodiments use conductive fingers (i.e. gate strips) of FinFET transistor structures to form a resonator structure. A "finger pitch" of conductive strip structure may be varied to define oscillation frequency of the resonator structure, rather that the fin pitch of a vertical fin structure. Further, in some examples, the S/D region of a resonator drive fin structure includes a dielectric material, such as oxide, such that these regions of the fins do not form S/D regions. In other words, in some examples, the drive FinFET finger structure does not function as a transistor. As such, disclosed examples provide a resonator structure with a tunable frequency, and that is also compatible with standard CMOS processes.

More particularly, some examples of the tunable resonator includes a horizontal finger structure, where the resonator frequency is based on the pitch of the horizontal finger structure. Some examples have a finger pitch range from 1 nm to 1000 nm. Further examples have a finger pitch of 90 nm to 130 nm, though other finger pitch dimensions are within the scope of this disclosure. Further, while the spacing between the fingers may be based on a predetermined finger pitch dimension, the actual pitch defined by the fingers may vary slightly due to process variations. Disclosed examples include both a vertical fin structure and the horizontal finger structure over the fins, where the number of fins is equal to, or less than the number of fingers. Some embodiments may include 5-50 fingers, with less than 20 fins. Other examples have 20-200 fingers, and less than 20 fins. Other combinations of the number of fingers and fins are within the scope of the disclosure.

In some examples, the resonator is formed of FinFET structures that include a plurality of horizontally-extending semiconductor fins that extend from a substrate, such as a silicon substrate, and form the transistor active area, including the S/D regions of the transistor. The FinFET gate structures (i.e. electrodes) include vertically-extending conductive strips, or "fingers" as discussed above. An oxide or other dielectric material (e.g. HfO2, SiC, SiN) is deposited between the fingers in what would be the S/D regions of the FinFET. However, in some examples discussed further below, S/D regions are not actually formed in the drive region since the resonator drive structure does not necessarily function as transistors.

The fingers may be formed by "stacking" a plurality of conductive structures (such as conductive metal layers) in a plurality of device layers. Some embodiments employ a constant finger pitch. In other words, a constant pitch is maintained between all of the device fingers. In other examples, the finger pitch may vary. For instance, the device may include some structures having a narrow pitch, while other structures have a wider pitch such that resonator frequency may be selectable.

In accordance with further aspects of the disclosure, examples of the resonator structure may have varying numbers of resonator unit cells. For example, some embodiments have 1-20 unit cells. Further, the number of unit cells per device may vary. For instance, some embodiments include one device with multiple unit cells. Other examples may have more than one device with multiple unit cells. Moreover, the finger pitch and location of such unit cells may vary.

FIG. 1 is a block diagram conceptually illustrating portions of a resonator 100 in conjunction with some disclosed examples. The resonator 100 includes a drive region 102 that, as will be discussed further below, includes a resonator structure including conductive fingers extending over semiconductor fins, where the resonator frequency is tunable based on the finger pitch of the conductive fingers. The drive region 102 receives an input drive signal Vdrive. The resonator structure of the drive region 102 resonates at a frequency based on the received drive signal, and the sense region 104 includes one or more sense transistors configured to sense the resonator signal generated by the drive region 102, and output a sense signal isense.

Figure 2:
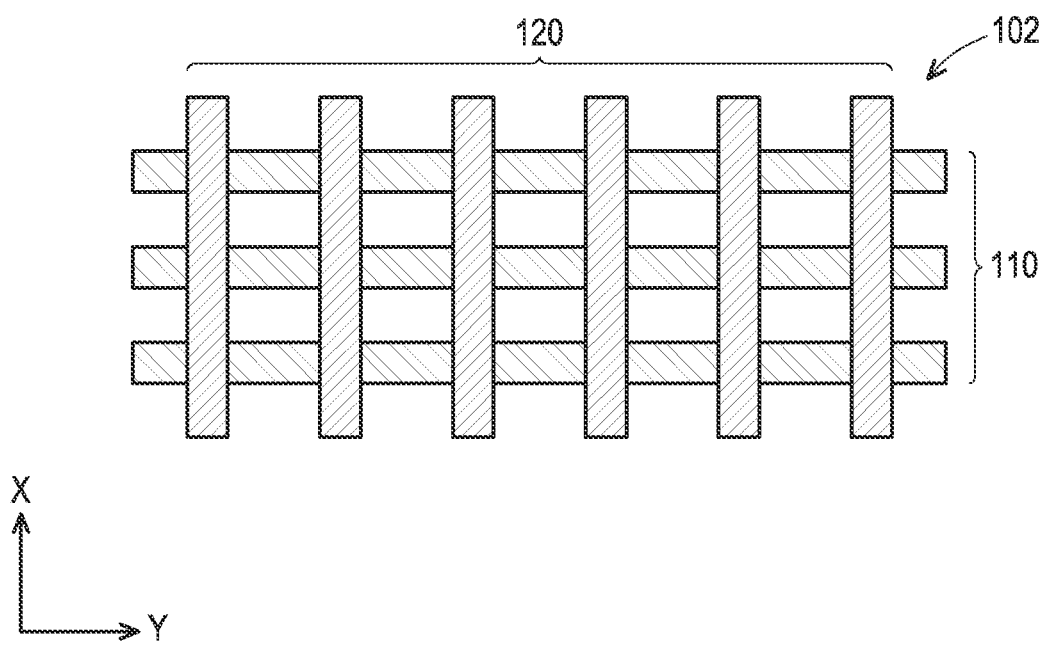
FIG. 2 is a schematic diagram illustrating an example of portions of a resonator device in accordance with some embodiments.
Figure 3:
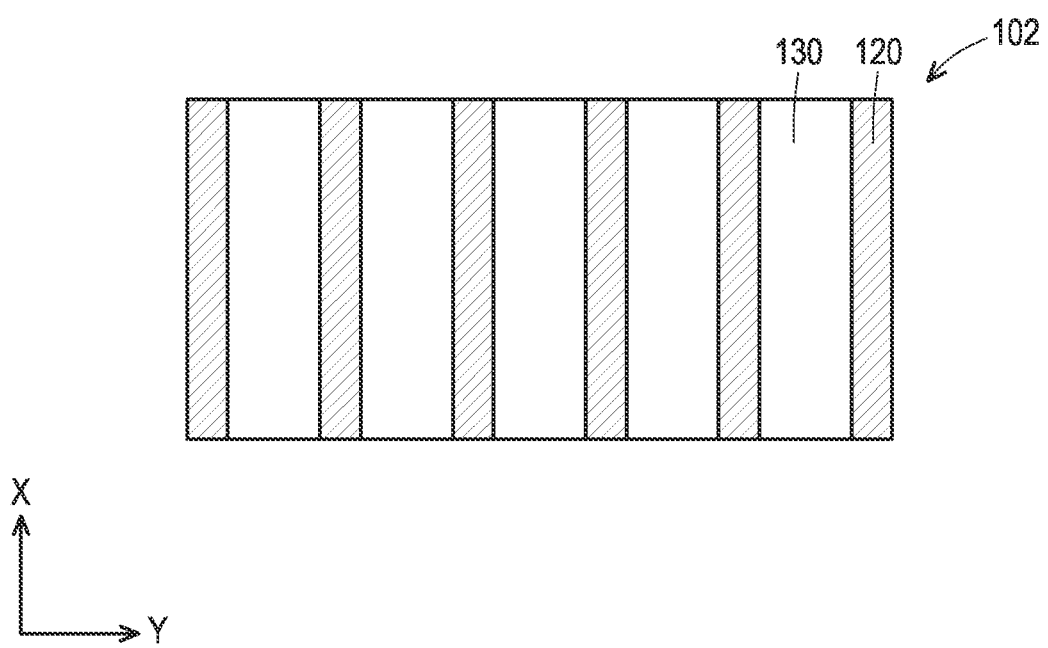
FIG. 3 is a schematic diagram illustrating an example of portions of a resonator device in accordance with some embodiments.

FIG. 2 illustrates further aspects of an example of the drive region 102. The drive region 102 includes fins 110 extending in a horizontal, or X direction. Conductive fingers 120 extend perpendicularly over the fins 110 in a vertical, or Y direction. In the example of FIG. 2, the drive region has fewer fins 110 (i.e. three fins) than fingers 120 (i.e. six fingers). As shown in FIG. 3, a dielectric 130 is deposited between the fingers 120 and over and around the fins 110.

Figure 4:
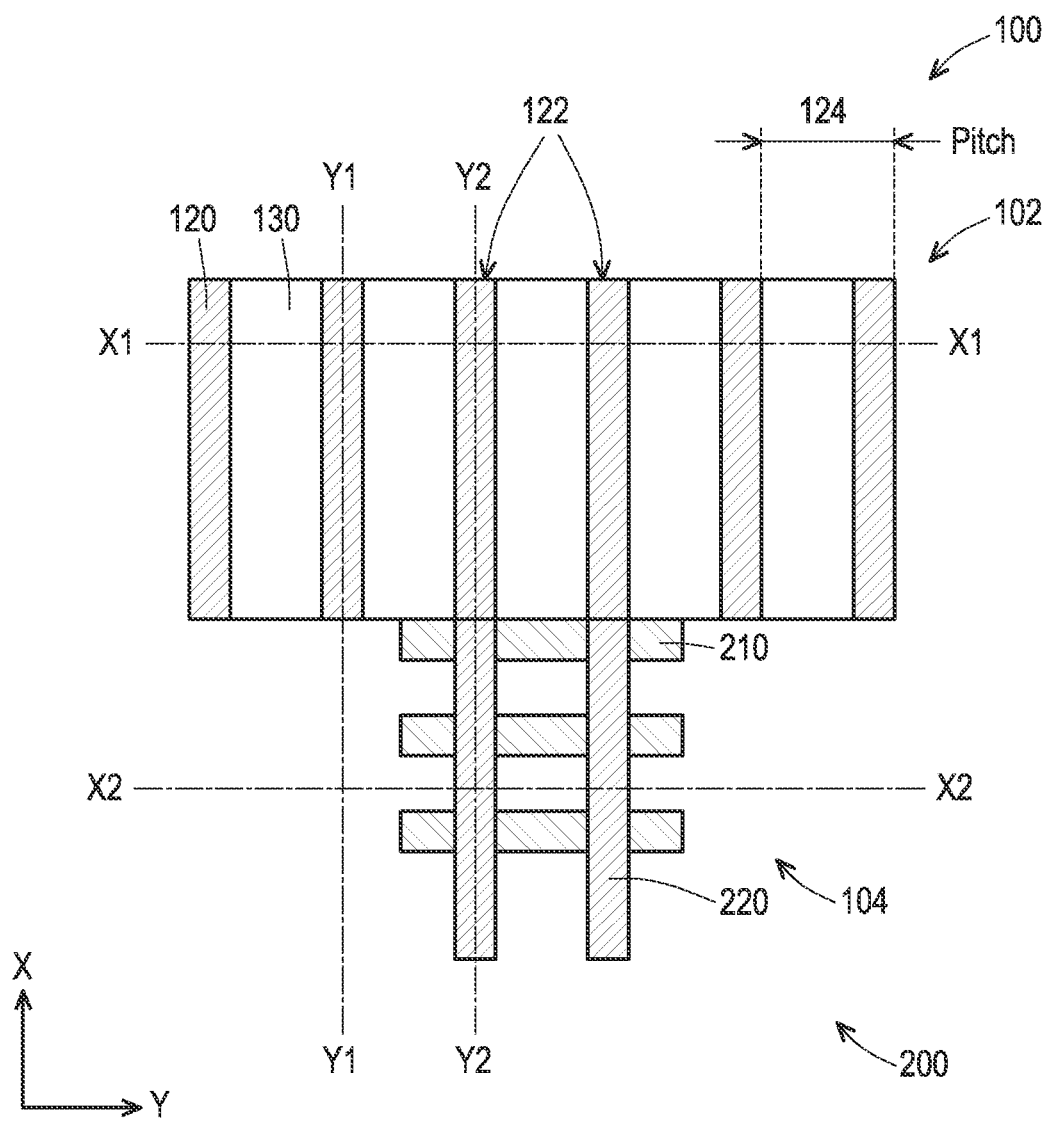
FIG. 4 is a schematic diagram illustrating an example of additional portions of a resonator device in accordance with some embodiments.

FIG. 4 illustrates still further aspects of the resonator device 100. As shown in FIG. 4, the drive region 102 is adjacent the sense region 104, with the sense region 104 positioned immediately below the drive region 102. As noted above, the fingers 120 of the drive region 110 are spaced apart based on a predetermined finger pitch 124 as shown in FIG. 4. As will be discussed further below, the finger pitch defines the resonance frequency of the drive region 102.

The sense region 104 includes one or more sense transistors 200. The sense transistors 200 include a gate, which may be formed of a gate conductive strip similar to the fingers 120. In some examples, the fingers 120 of the drive region 102 include "dummy" fingers 122 that are formed along with the conductive fingers 120 of the drive region, extending parallel thereto. However, the dummy fingers 120 do not receive the input signal Vdrive, but instead pass the resonator signal from the drive region 102 to the sensing region 104.

In the illustrated example, the sense transistors 200 are FinFET transistors that include one or more sense transistor fins 210 extending in the X direction, with the dummy fingers 122 extending over the fins 210 to form the gates 220 of the sense transistors 200, as will be discussed further below.

Figure 5:
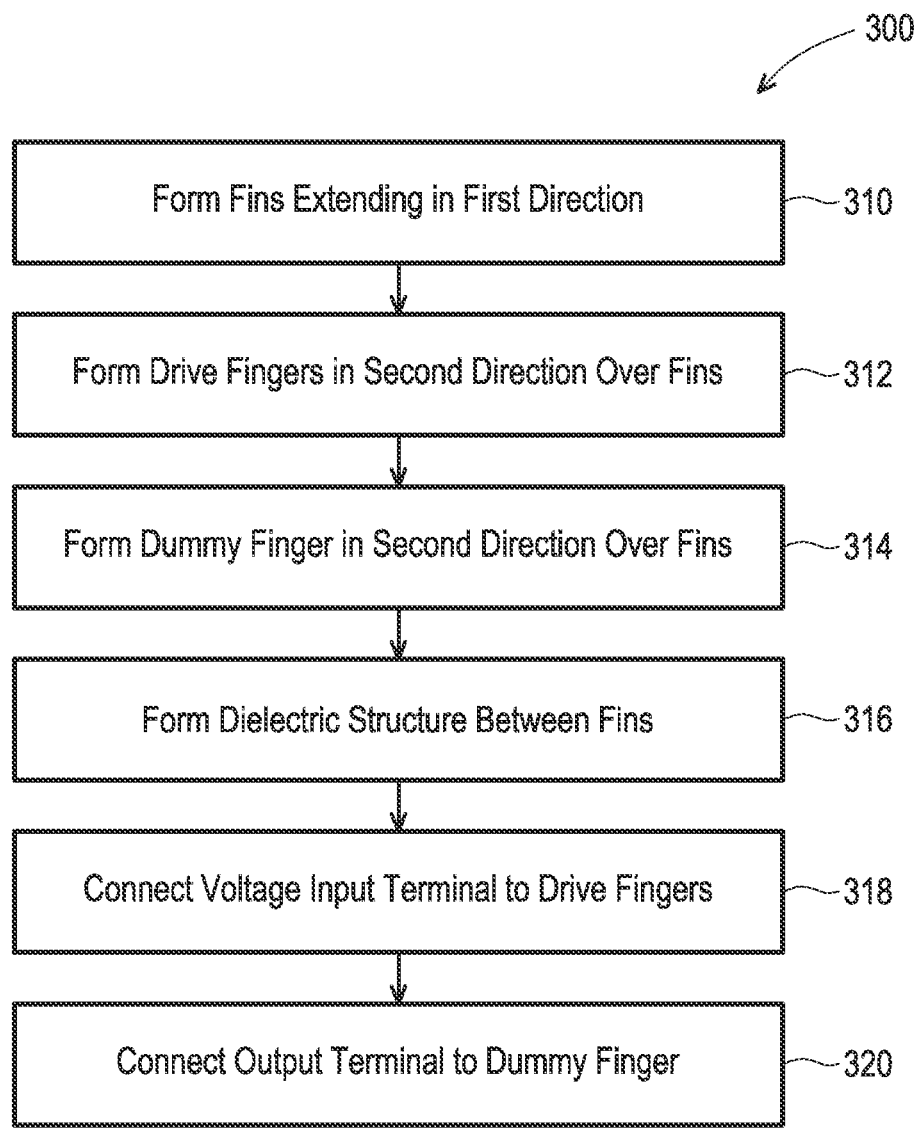
FIG. 5 is a flow diagram illustrating an example method of fabricating a resonator in accordance with some embodiments.
Figure 6:
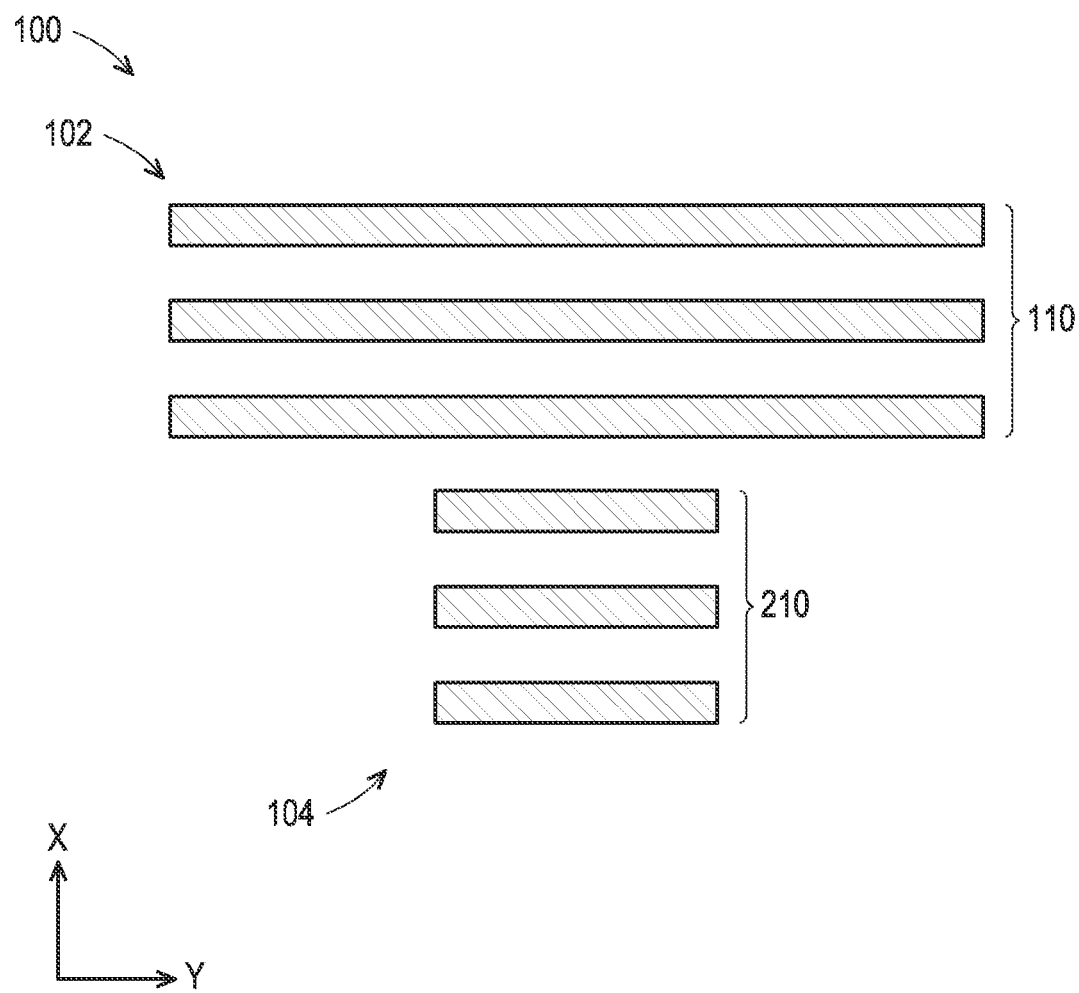
FIG. 6 is a schematic diagram illustrating an example of fins of a resonator device in accordance with some embodiments.

FIG. 5 is a flow diagram illustrating aspects of a method 300 of forming a resonator, such as the resonator 100 shown in FIG. 4. At an operation 302, fins are formed on or over a substrate. The fins may include the drive region fins 110 and the sensing region fins 210, as shown in FIG. 6. The substrate may be made of silicon or other semiconductor materials. Alternatively or additionally, the substrate may include other elementary semiconductor materials such as germanium. In some embodiments, the substrate is made of a compound semiconductor such as silicon carbide, gallium arsenic, indium arsenide, or indium phosphide. In some embodiments, the substrate is made of an alloy semiconductor such as silicon germanium, silicon germanium carbide, gallium arsenic phosphide, or gallium indium phosphide.

In some examples, forming the fins in operation 310 includes forming a pad layer and a hard mask layer on the substrate. A photoresist layer is formed on the hard mask layer, and the photoresist layer is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process The pad layer is a buffer layer between the substrate and the hard mask layer. In addition, the pad layer is used as a stop layer when the hard mask layer is removed. The pad layer may be made of silicon oxide. The hard mask layer may be made of silicon oxide, silicon nitride, silicon oxynitride, or another applicable material. In some other embodiments, more than one hard mask layer is formed on the pad layer. The pad layer and the hard mask layer are formed by deposition processes, such as a chemical vapor deposition (CVD) process, high-density plasma chemical vapor deposition (HDPCVD) process, spin-on process, sputtering process, or another applicable process.

After the photoresist layer is patterned, the pad layer and the hard mask layer are patterned by using the patterned photoresist layer as a mask. As a result, a patterned pad layer and a patterned hard mask layer are obtained. An etching process is performed on the substrate to form the fin structure 110, 210 by using the patterned pad layer and the patterned hard mask layer as a mask. The etching process may be a dry etching process or a wet etching process. In some embodiments, the substrate is etched by a dry etching process. The dry etching process includes using the fluorine-based etchant gas, such as SF6, CxFy, NF3 or combinations thereof. The etching process may be a time-controlled process, and continue until the fins 110, 210 reach a predetermined height. In some other embodiments, the fin structures 110, 210 have a width that gradually increases from the top portion to the lower portion. After the fin structures are formed, the photoresist layer is removed.

Figure 7:
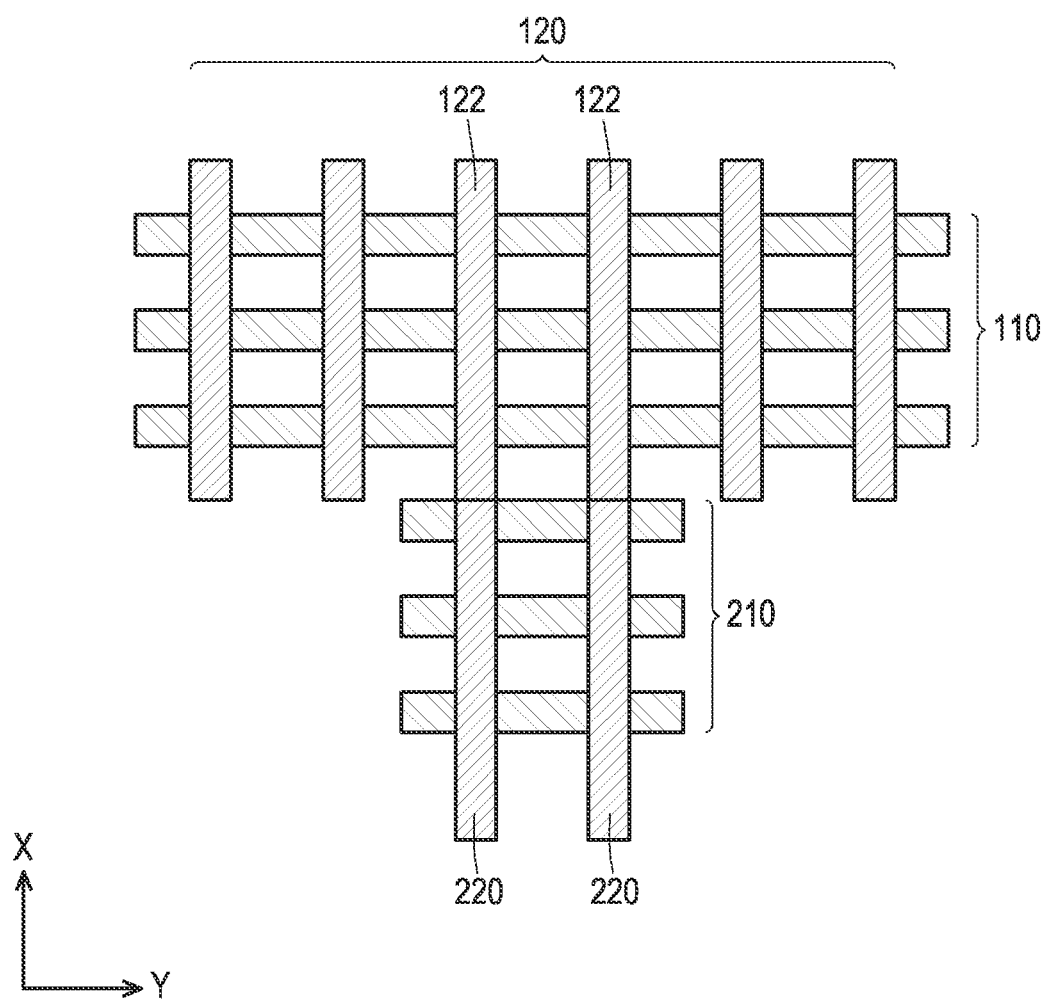
FIG. 7 is a schematic diagram illustrating an example of fins and conductive fingers of a resonator device in accordance with some embodiments.

At operations 312 and 314 of FIG. 5, drive fingers and a dummy finger are formed over the fins. The drive fingers and the dummy finger may include the drive region fingers 120 and the dummy fingers 122, as well as the gates 220 of the sense transistors 200. FIG. 7 illustrates an example of the arrangement of the fins 110, 210 and the fingers 120, including dummy fingers 122 and sense transistor gates 220. The dummy fingers 122 may further extend over the fingers 210 of the sense transistors 200, thus forming gates 220 of the sense transistors 200. In other examples, the conductive gate strips 220 of the sense transistors 220 may be separately formed and electrically connected to the dummy fingers 122. The fingers 120, 122 and sense transistor gate 220 can be formed, for example, as typical FinFET gate structures, such as poly-silicon gate, metal gate, or the like.

The fingers 110, 210, which may be conventional FinFET gate structures, may include a gate dielectric layer and a gate electrode layer. The gate dielectric layer is made of dielectric materials, such as silicon oxide, silicon nitride, silicon oxynitride, dielectric material(s) with high dielectric constant (high-k), or combinations thereof. The gate dielectric layer is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the fingers (i.e. gate structures) 110, 210 are made of conductive materials, and may be a polysilicon gate (poly or dummy gate) or metal gate (replacement metal gate). For example, the gate electrode layer 210 may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Returning to FIG. 5, a dielectric material 130, such as oxide, is formed in the S/D regions of the drive region fins 110 in operation 316. In some embodiments, a contact etch stop layer (CESL) is formed before the dielectric structure 130 is formed. In example embodiments, the dielectric material may include silicon oxide, hafnium oxide, silicon carbide, silicon nitride, and/or other applicable dielectric materials. Moreover, the dielectric 130 my include multi-layers made of multiple dielectric materials.

As noted above, the drive region includes the fins 110 and fingers 120, 122 (i.e. gate structures) in accordance with CMOS FinFET structures. In some embodiments, S/D structures 130 are formed by growing a strained material on the fins 110, 210 by an epitaxial (epi) process. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes. However, as discussed further below, the fingers 120 are configured to receive a drive signal whereby the drive region 102 functions as a resonator with a resonant frequency that is tunable based on the finger pitch. As such, S/D structures are not necessarily formed in the fins 110 of the drive region 102 (i.e. there is no S/D epi).

Figure 8:
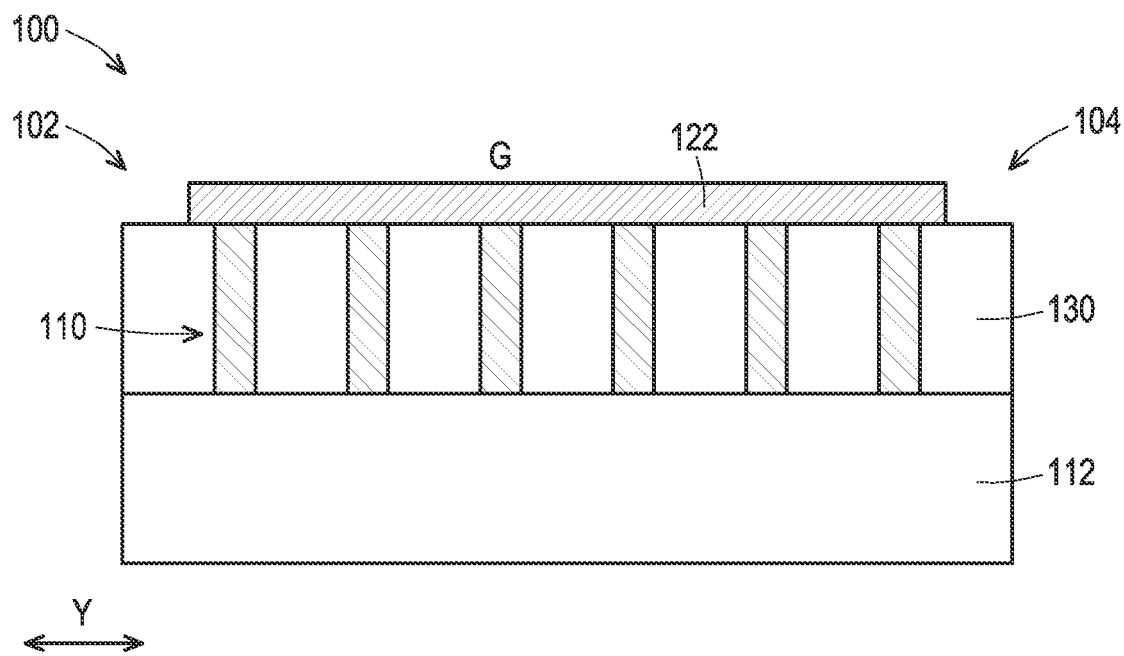
FIG. 8 is a schematic section view taken along line Y2 of FIG. 4 in accordance with some embodiments.

FIG. 8 is a section view taken along line Y2 of FIG. 4, showing the fins 110 extending over the substrate 112. The fingers 120 are situated over the fingers 110. The section view of FIG. 8 illustrates one of the dummy fingers 122, which extends over the sense transistor fins 210, forming a gate 220 of the sense transistor 200. The dielectric 130 is situated on the S/D regions of the fins 110 in the drive region 102.

Figure 9:
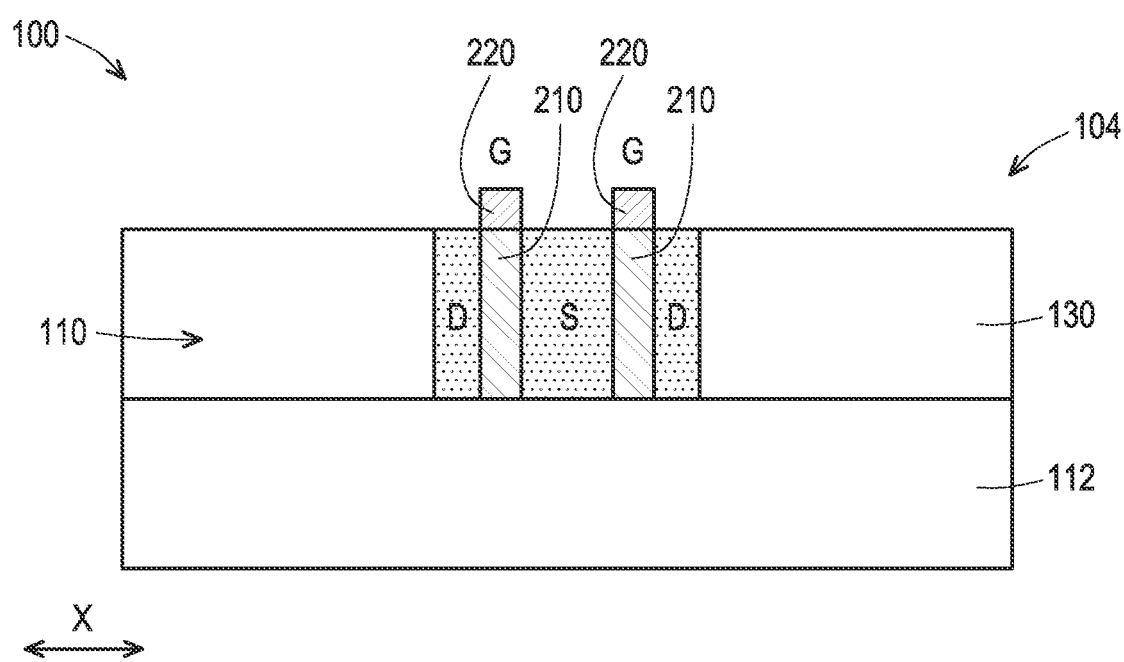
FIG. 9 is a schematic section view taken along line X2 of FIG. 4 in accordance with some embodiments.

FIG. 9 is a section view taken along line X2 of FIG. 4, illustrating portions of the sensing region 104. One of the fingers 210 forming the sense transistors 200 is shown with its source S and drain D regions, and the sensing transistor conductive gate strips 220. Thus, the sensing transistors 200 may be standard FinFET transistors, with source and drain nodes and a channel formed between the source and drain nodes. As noted above, in the illustrated example the dummy fingers 122 extend over the sensing transistor fins 210, forming the gates 220 thereof.

Figure 10:
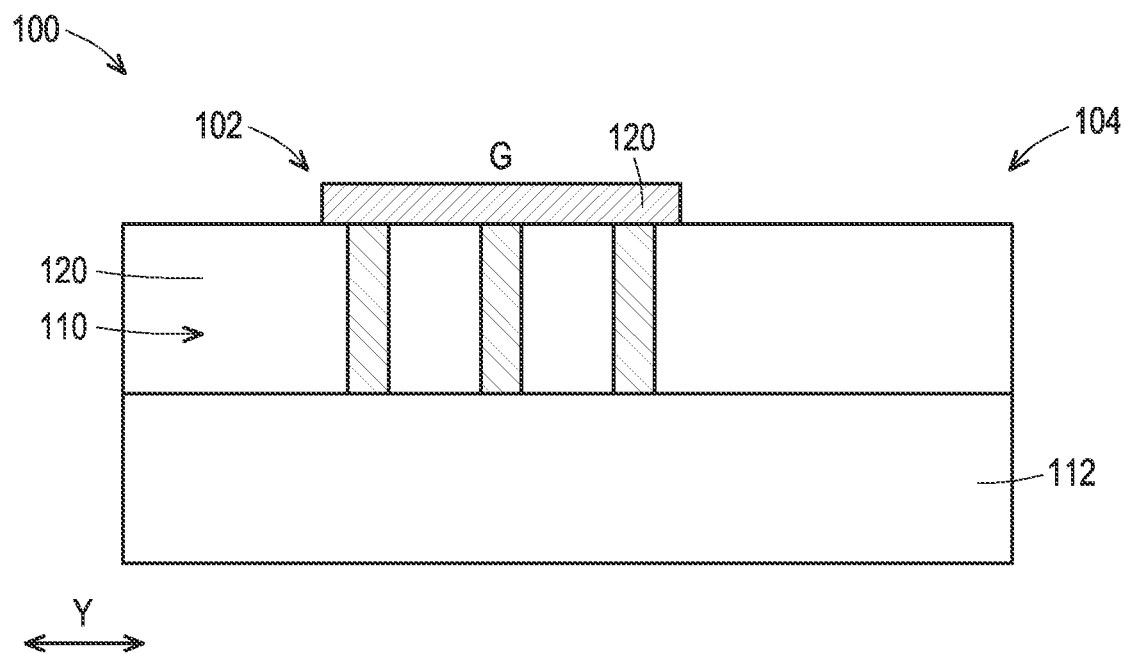
FIG. 10 is a schematic section view taken along line Y1 of FIG. 4 in accordance with some embodiments.
Figure 11:
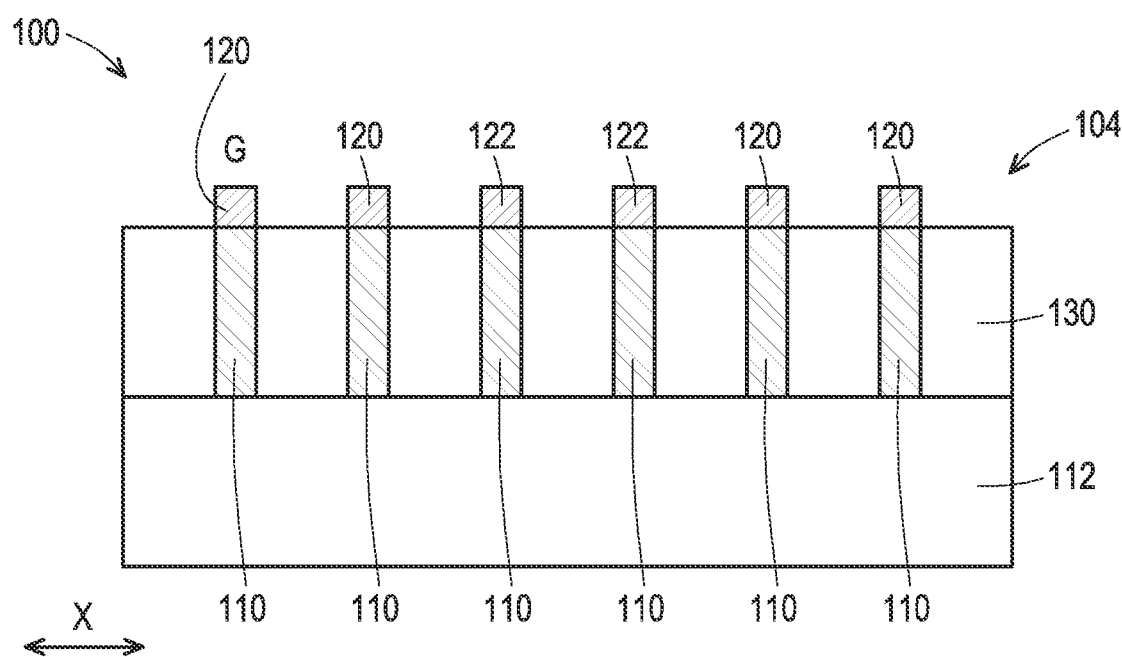
FIG. 11 is a schematic section view taken along line X1 of FIG. 4 in accordance with some embodiments.

FIG. 10 is a section view taken along line Y1 of FIG. 4, showing one of the fingers 120 over the fins 120 of the drive region 102. The oxide 130 is situated in the S/D region of the fins 110. FIG. 11 is a section view taken along line X1 of FIG. 4, illustrating a portion of the drive region 102. The fingers 120, including the dummy fingers 122, extend over the fingers 110 extending from the substrate 112. The oxide 130 is situated in the S/D regions of the fingers 110.

Figure 12:
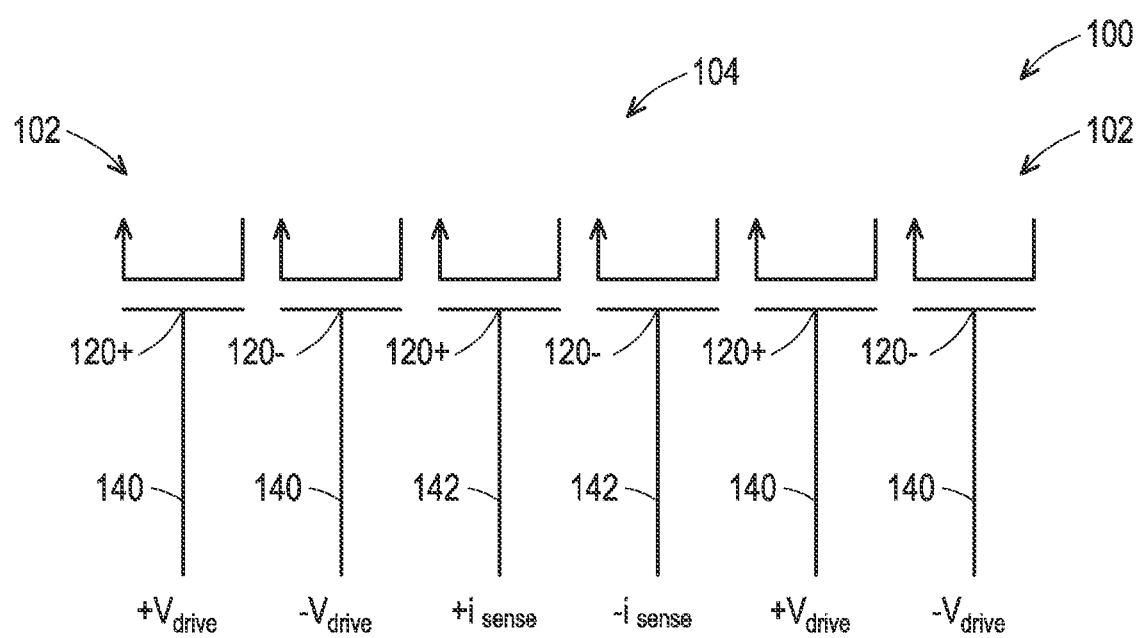
FIG. 12 is a circuit diagram illustrating an example resonator circuit in accordance with some embodiments.

Returning to the method shown in FIG. 5, operation 318 includes connecting a voltage input terminal configured to receive a drive signal to the plurality of conductive drive fingers, and operation 320 includes connecting the dummy finger to an output terminal configured to output a sense current. More particularly, FIG. 12 is a circuit diagram of an example of the resonator 100 disclosed herein. The fingers 120 are electrically connected to voltage input terminals 140 that are configured to receive opposite polarity drive voltage signals +Vdrive/−Vdrive. As shown in the example of FIG. 12, pairs of the fingers 120+, 120− are connected to the input terminals 140 to receive the respective +Vdrive, −Vdrive, drive signals, which are RF signals in some embodiments. The input signals +Vdrive, −Vdrive received by the input terminals 140 connected to the respective fingers 120+, 120− (i.e. gates) cause the drive transistor structures in the drive region 102 to resonate. Dummy gates 122+, 120− of the sense transistor structures in the sensing region 104 are connected to output terminals 142 to provide opposite polarity sense currents +isense, −isense.

Figure 13:
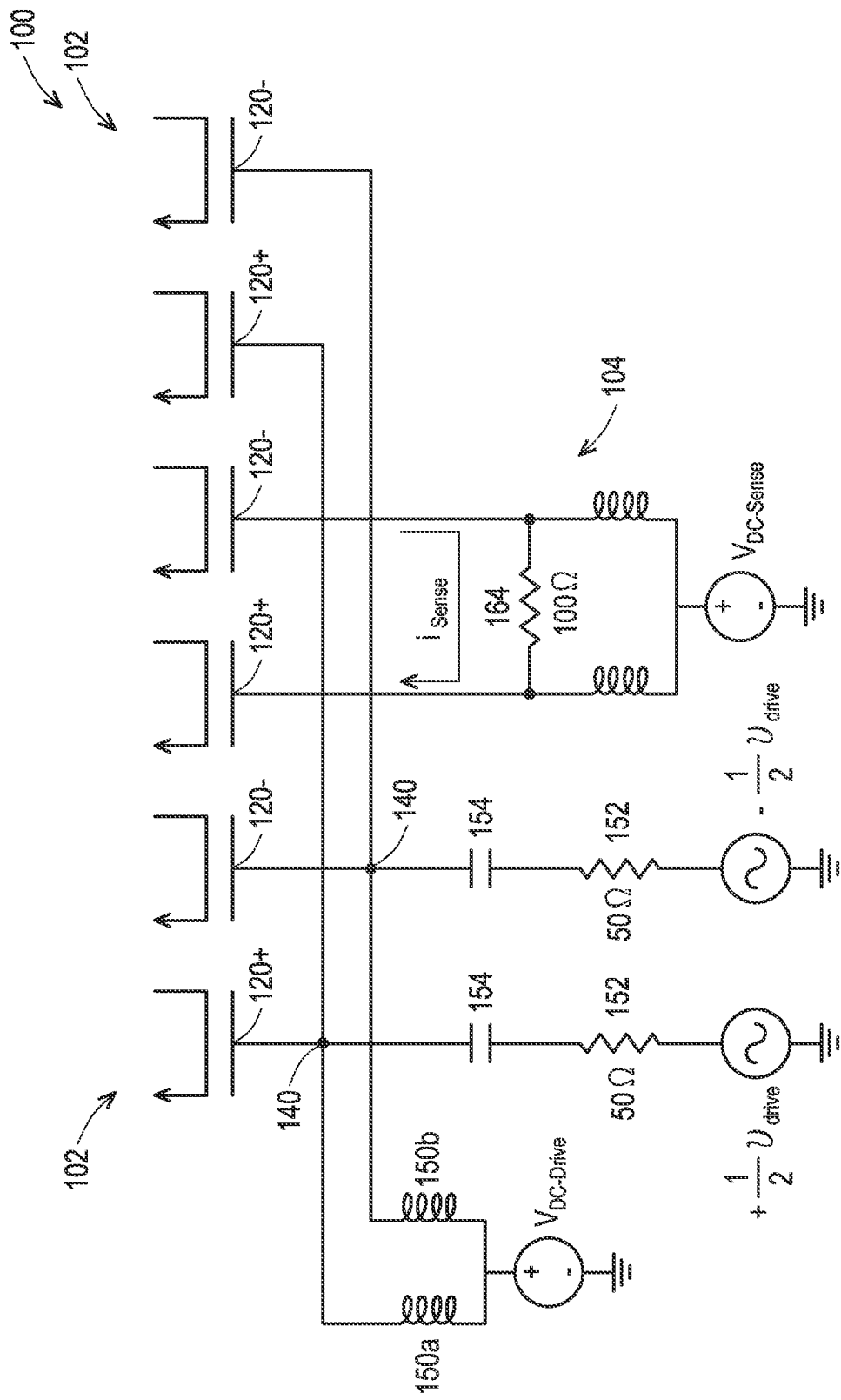
FIG. 13 is a circuit diagram illustrating another example resonator circuit in accordance with some embodiments.

FIG. 13 is a circuit diagram illustrating further aspects of an example of the resonator 100. In FIG. 13, a DC drive voltage VDC-drive is connected to inductors 150a, 150b respectively connected to the voltage input terminals 140 for the fingers 120+, 120− to provide the opposite polarity drive voltage signals. Alternating opposite polarity periodic drive signals +½vdrive, −½vdrive are additionally connected to the voltage input terminals 140 of the respective fingers 120+, 120− through resistors 152 and capacitors 154. The periodic drive signals +½vdrive, −½vdrive are RF signals in some examples. The dummy fingers 122+, 122− are connected to output the sense current isense across a load resistor 164 connected to inductors 162, which are connected to a DC sense voltage VDC-sense. In the example shown in FIGS. 12 and 13, the fingers 120+, 120− are illustrated as gate terminals of transistors (i.e. FET schematic symbols are shown in FIGS. 12 and 13). However, as discussed hereinabove, in some examples source and drain regions of the fins 110 in the drive region 102 are not necessarily formed. Instead, the source and drain regions of the fins 110 are filled with a dielectric material, such as oxide (i.e. there is no source/drain epi).

Figure 14:
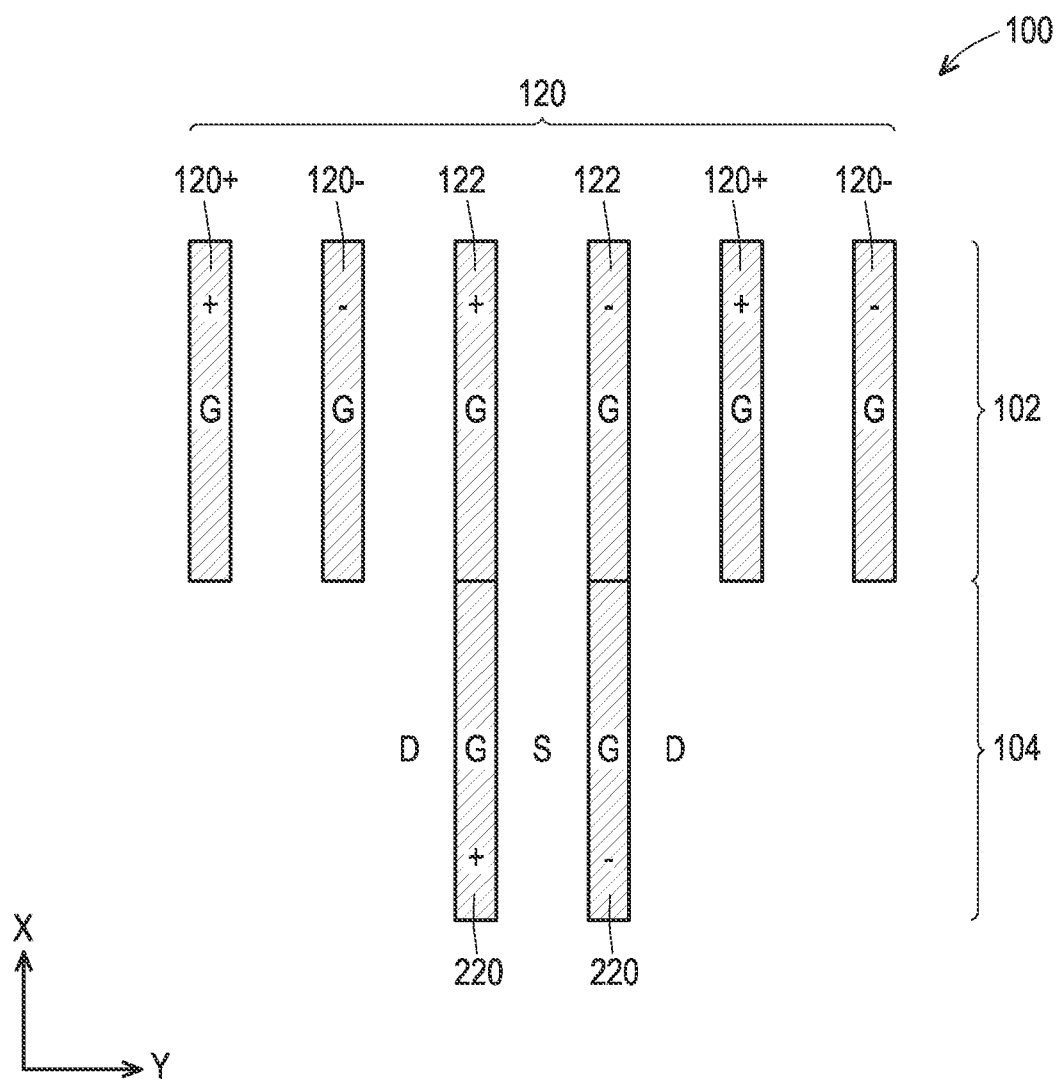
FIG. 14 is a schematic diagram illustrating an example of a conductive finger arrangement of a resonator device in accordance with some embodiments.
Figure 15:
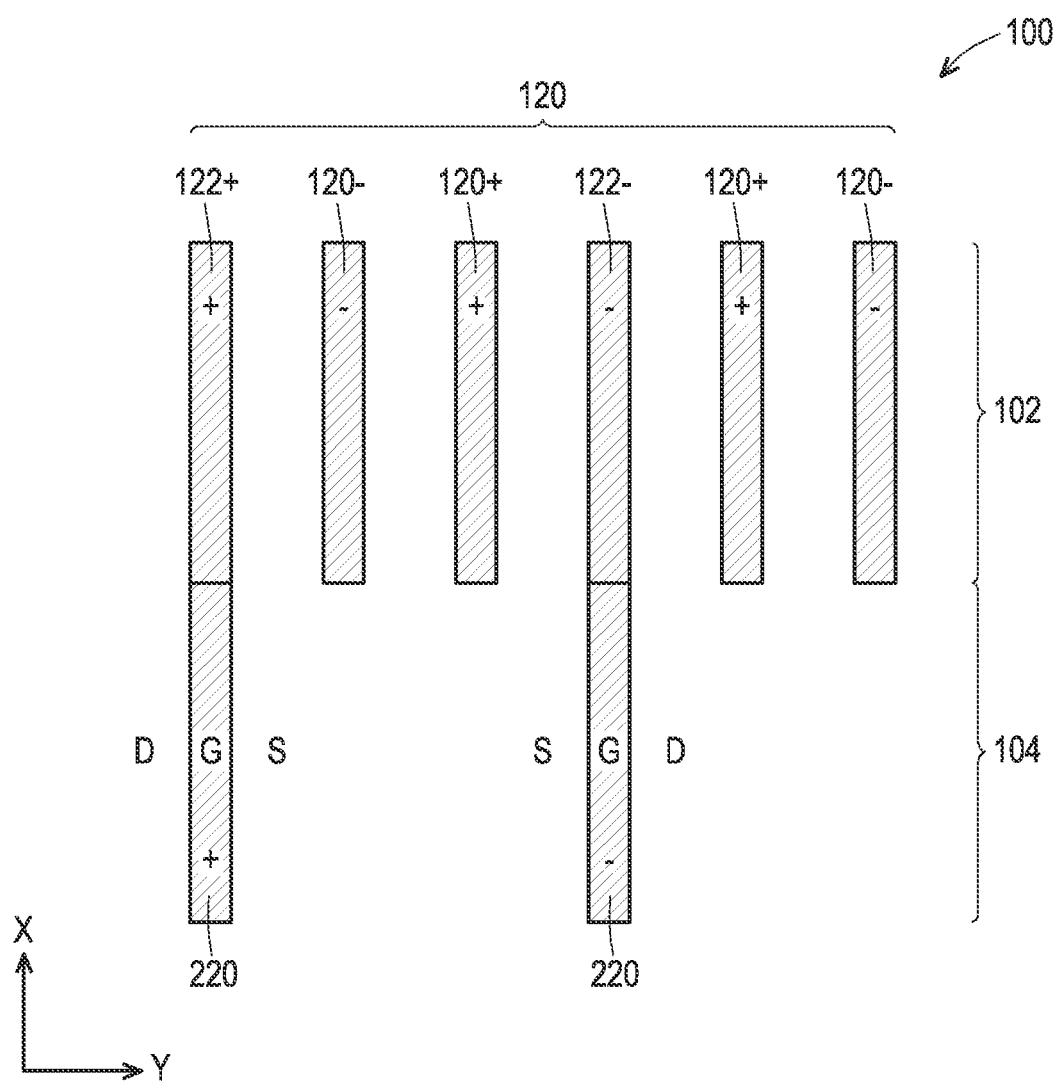
FIG. 15 is a schematic diagram illustrating another example of a conductive finger arrangement of a resonator device in accordance with some embodiments.
Figure 16:
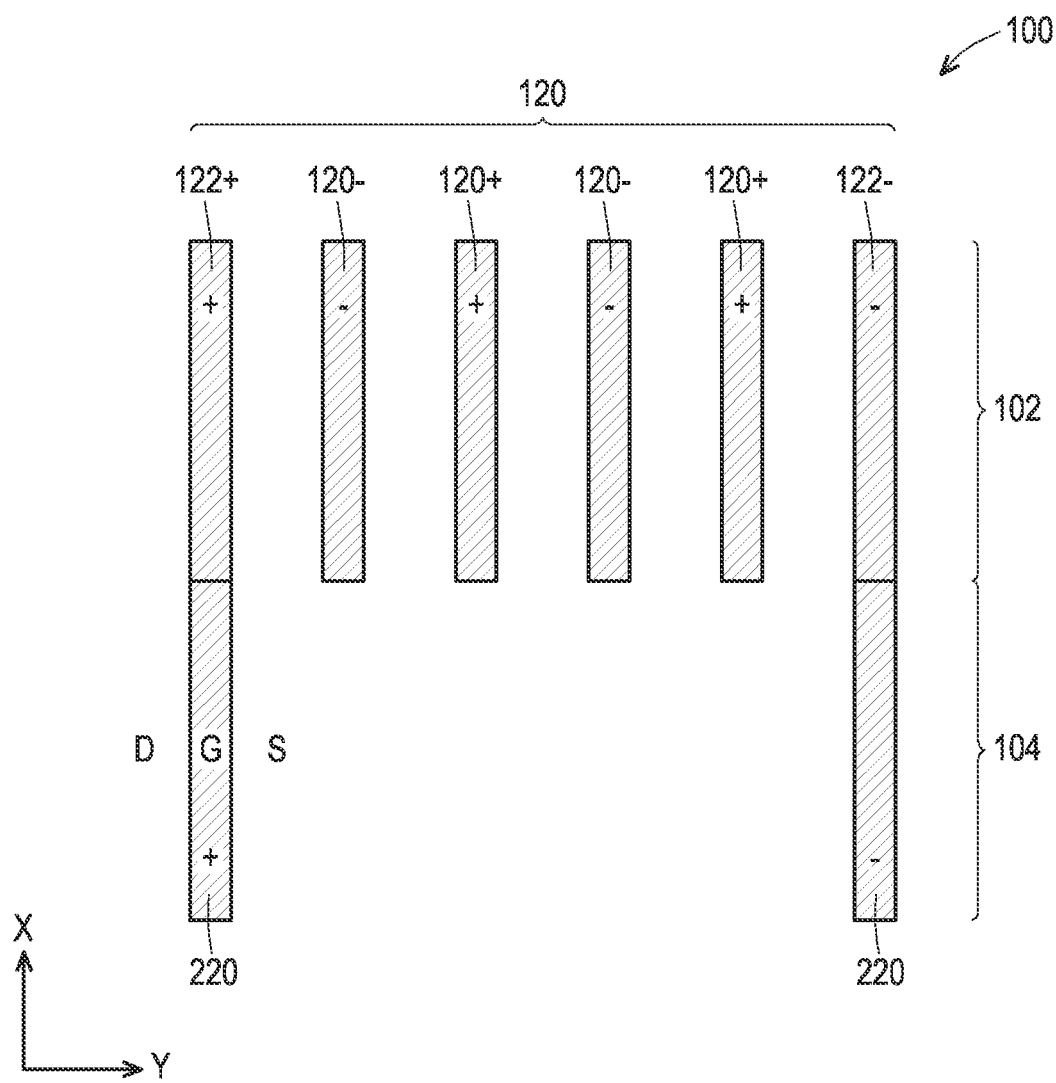
FIG. 16 is a schematic diagram illustrating another example of a conductive finger arrangement of a resonator device in accordance with some embodiments.

FIGS. 14-16 illustrate examples of different arrangements of the conductive fingers 120 and dummy fingers 122, which may form the gates 220 of the sensing transistors 200. In some examples, such as that illustrated in FIG. 14, the dummy fingers 122 are situated adjacent one another. The dummy fingers 122 extend from the drive region 102 to the sensing region 104 and form the gates of the sense transistors 200. In other examples, the dummy fingers 122 are separated from one another by fingers 122 of the drive region 102. In FIG. 15, the dummy fingers 122+, 122− are separated by one pair of the fingers 120−, 120+. In FIG. 16, the dummy fingers 122+, 122− are on opposite ends of the resonator 100, and as such, are separated by two pairs of the fingers 120+, 120−. Still further, it is noted that the disclosure is not limited to illustrated arrangement where the sense region 104 is immediately adjacent the drive region 102. In other embodiments, the sense region 104 (i.e. sense transistors 200) may be located separate from the fins 110 and fingers 120, 122 of the drive region 102.

Figure 17:
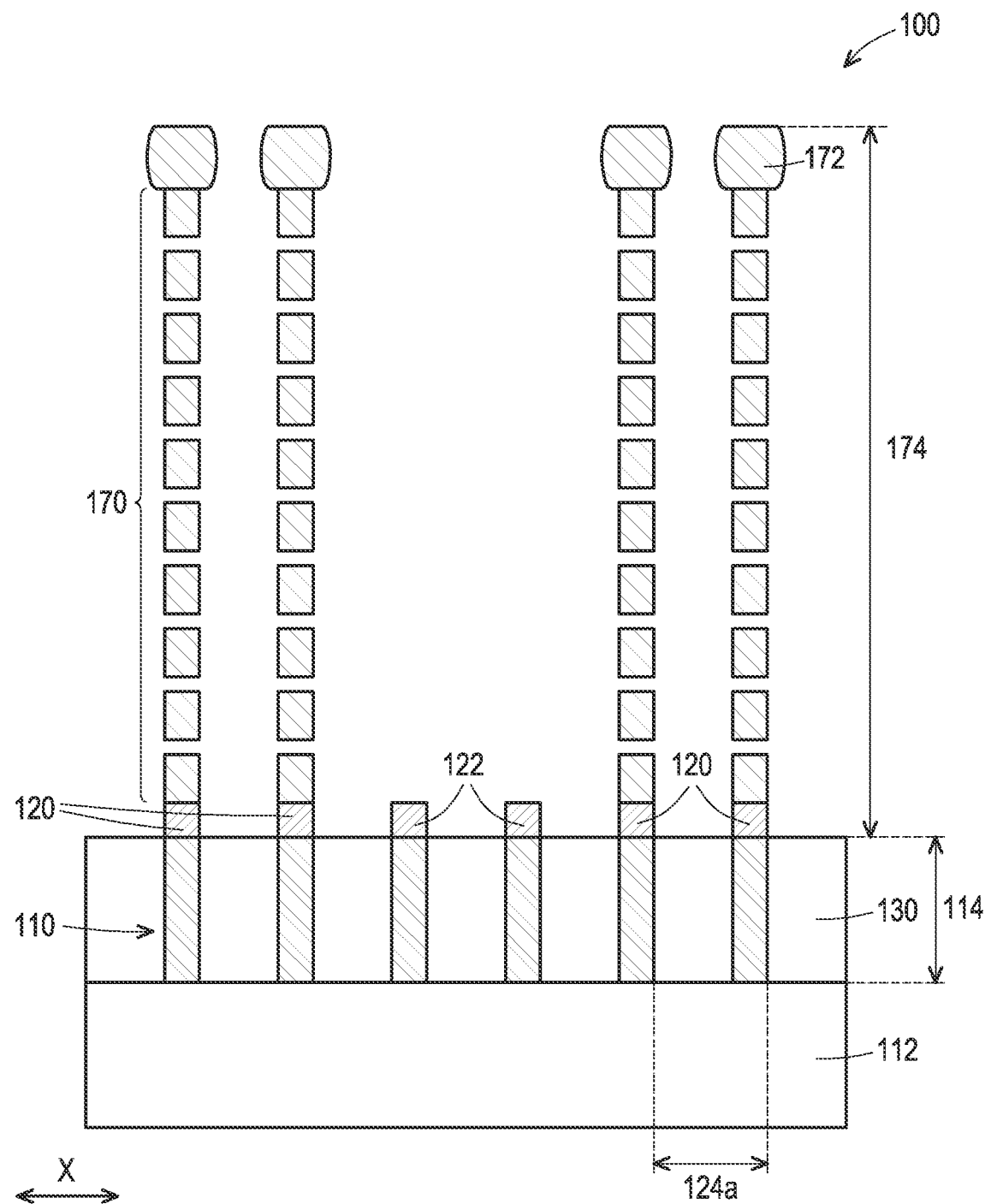
FIG. 17 is a schematic section view illustrating metal layers of a conductive finger arrangement of a resonator device in accordance with some embodiments.
Figure 18:
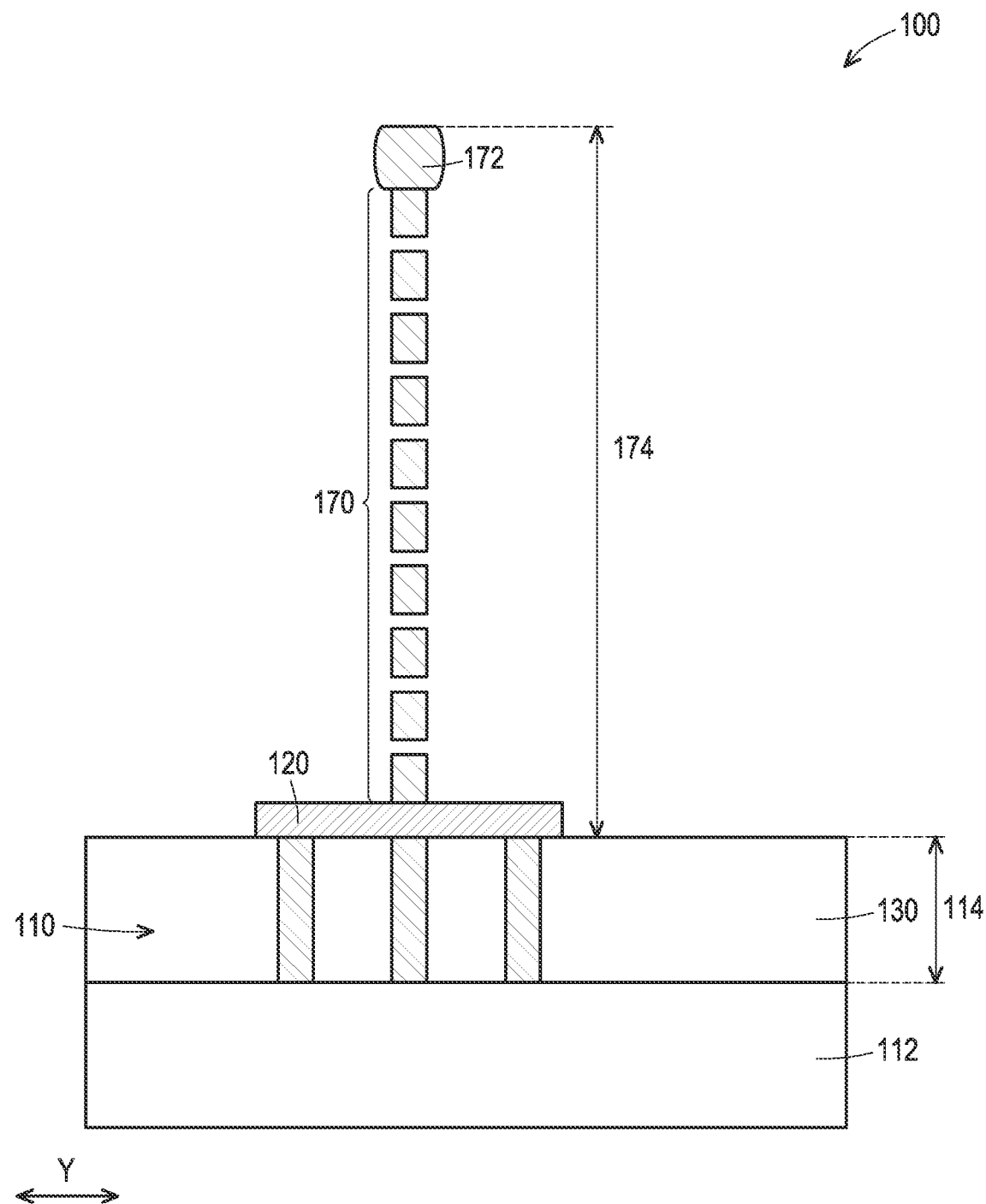
FIG. 18 is a schematic section view illustrating further aspects of metal layers of a conductive finger arrangement for a resonator device in accordance with some embodiments.

In some examples, the fingers 120 may include a conductive gate strip, such as a poly gate. Further, a plurality of conductive layers may be "stacked" over the conductive gate strips to form the fingers 120 and dummy fingers 122. FIGS. 17-22 illustrate various examples. More specifically, FIG. 17 is a section view in the same orientation as that shown in FIG. 11 (i.e. line X1 in FIG. 4), and FIG. 18 is a section view in the same orientation as that shown in FIG. 10 (i.e. line Y1 in FIG. 4). A plurality of conductive layers, such as metal layers 170, are over the conductive fingers 120 and electrically connected thereto. The metal layers 170 may stack up to respective conductive connection bumps 172. The conductive gate strips of the fingers 120 together with the stacked metal layers 170 thus form a finger height 174 dimension. In some examples, the finger height 174 is greater than a fin height 114.

Figure 19:
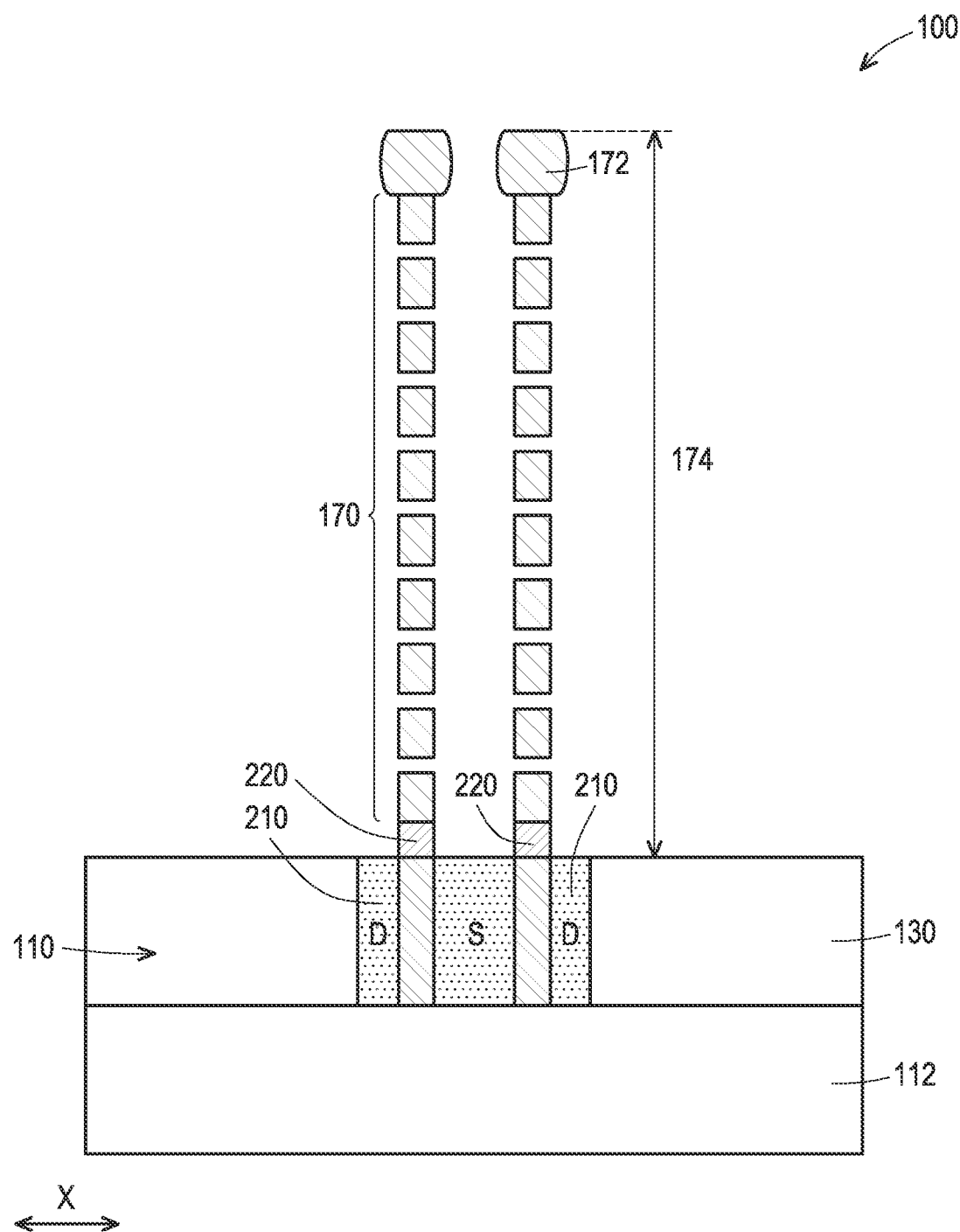
FIG. 19 is a schematic section view illustrating further aspects of metal layers of a conductive finger arrangement for a resonator device in accordance with some embodiments.
Figure 20:
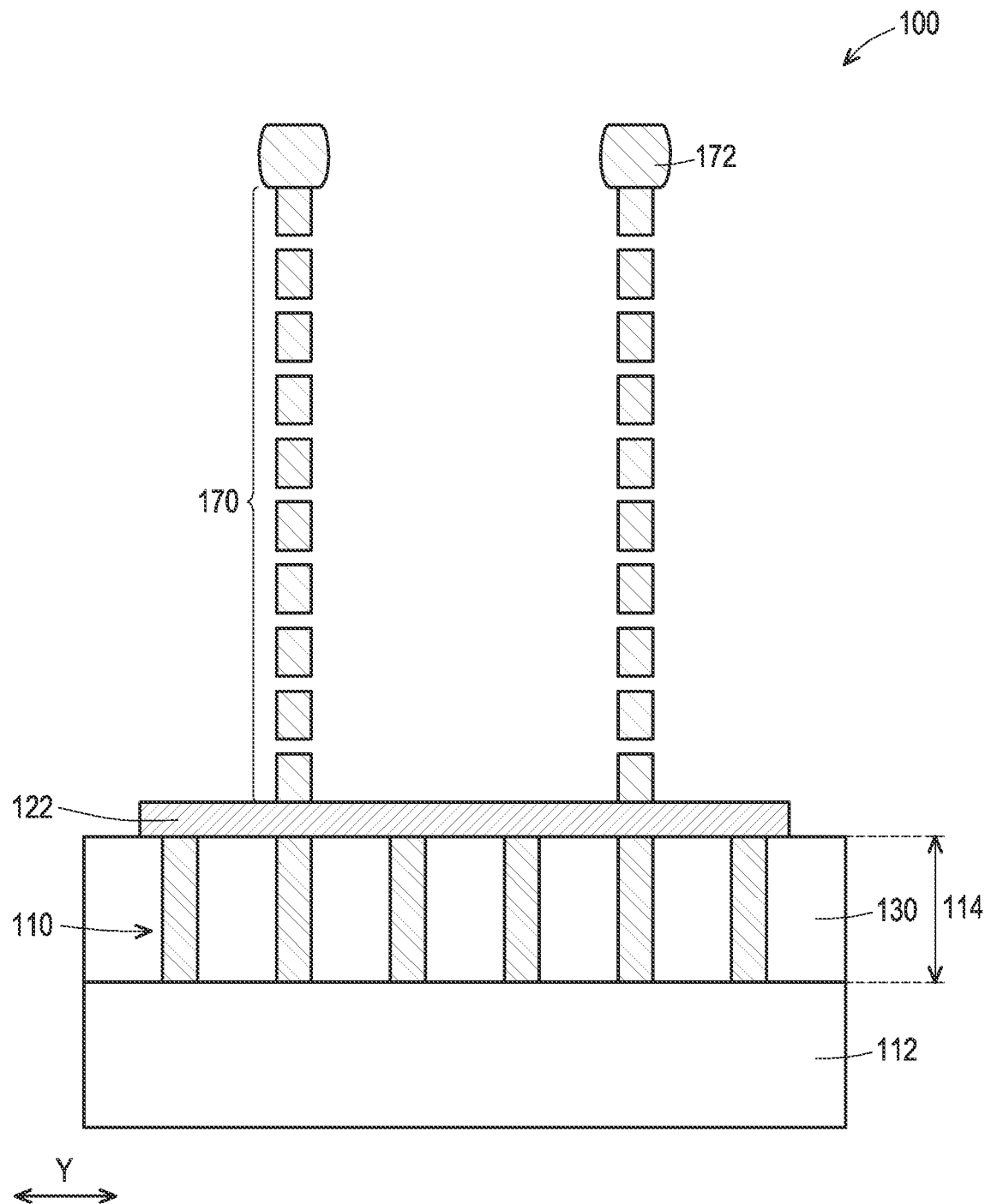
FIG. 20 is a schematic section view illustrating further aspects of metal layers of a conductive finger arrangement for a resonator device in accordance with some embodiments.

FIG. 19 is a section view in the same orientation as that shown in FIG. 9 (i.e. line X2 in FIG. 4), and FIG. 20 is a section view in the same orientation as that shown in FIG. 8 (i.e. line Y2 in FIG. 4). Metal layers 170, which may stack up to the respective conductive connection bumps 172, are over the gate strips 220 of the sensing transistors 200 and electrically connected thereto.

Figure 21:
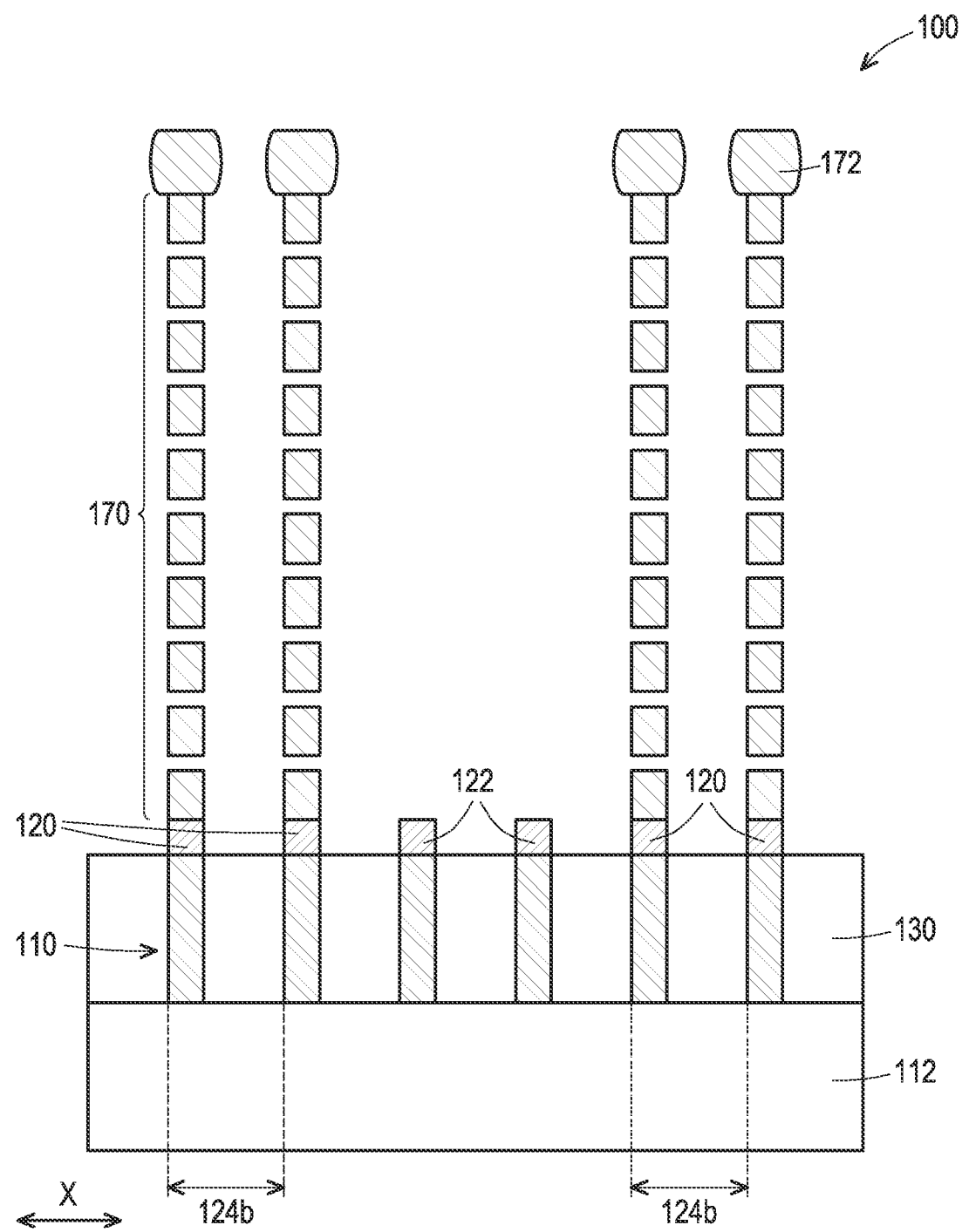
FIG. 21 is a schematic section view illustrating varying finger pitch of a conductive finger arrangement for a resonator device in accordance with some embodiments.

In the examples shown in FIGS. 17-20, the fingers 120 have a constant pitch. In other words, each of the fingers 120 define the same separation therebetween. In other examples, the finger pitch may vary. FIG. 21 is a section view in the same orientation as that shown in FIG. 17 (i.e. line X1 in FIG. 4). In the in the example of FIG. 21, the fingers 120 define a wider pitch 124b as compared to the narrower pitch 124a defined by the fingers 120 in FIG. 17. Further, in FIGS. 17 and 21, all of the fingers 120 have the same pitch (i.e. all of the fingers 120 are separated by the same distance).

Figure 22:
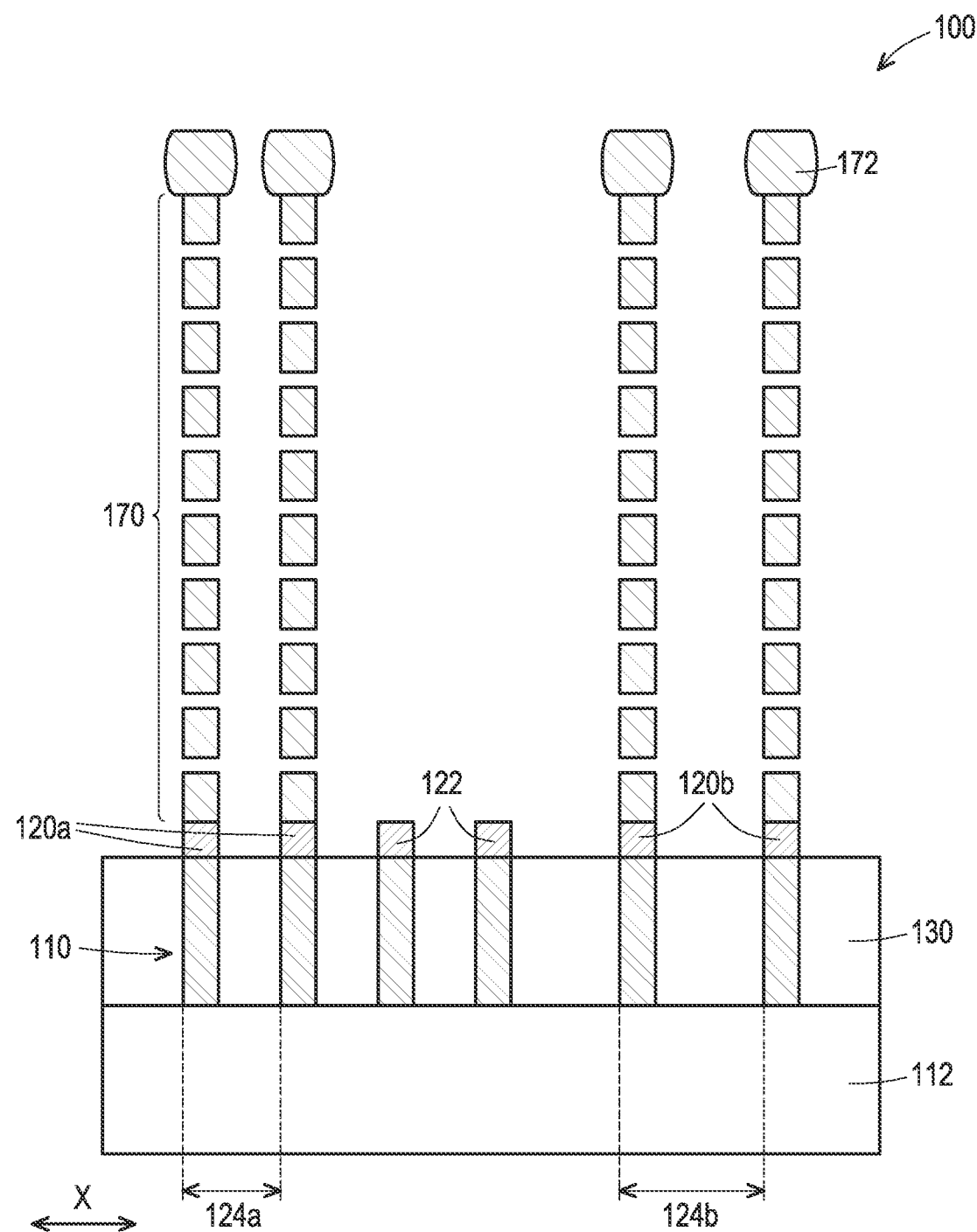
FIG. 22 is a schematic section view illustrating further varying finger pitch of a conductive finger arrangement for a resonator device in accordance with some embodiments.

FIG. 22 is a section view in the same orientation as that shown in FIGS. 17 and 21 (i.e. line X1 in FIG. 4), illustrating an example in which the device 100 includes fingers 120 with different pitches 124a, 124b. More specifically, the pair fingers 120a shown on the left side of FIG. 21 define a narrow pitch 124a, while the pair of fingers 120b shown on the right side of FIG. 21 define a wide pitch 124b. As noted above, the frequency of the resonator 100 may be tuned by varying the finger pitch 124.

Figure 23:
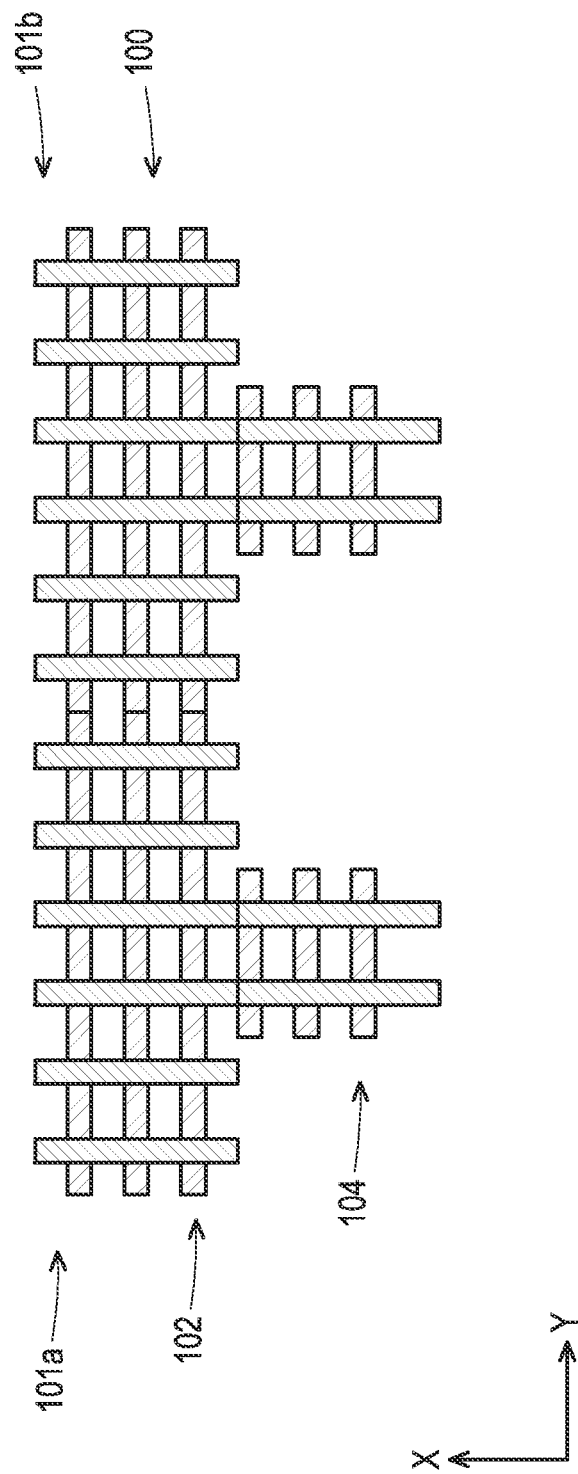
FIG. 23 is a schematic diagram illustrating a multiple resonator cell arrangement for a resonator device in accordance with some embodiments.
Figure 24:
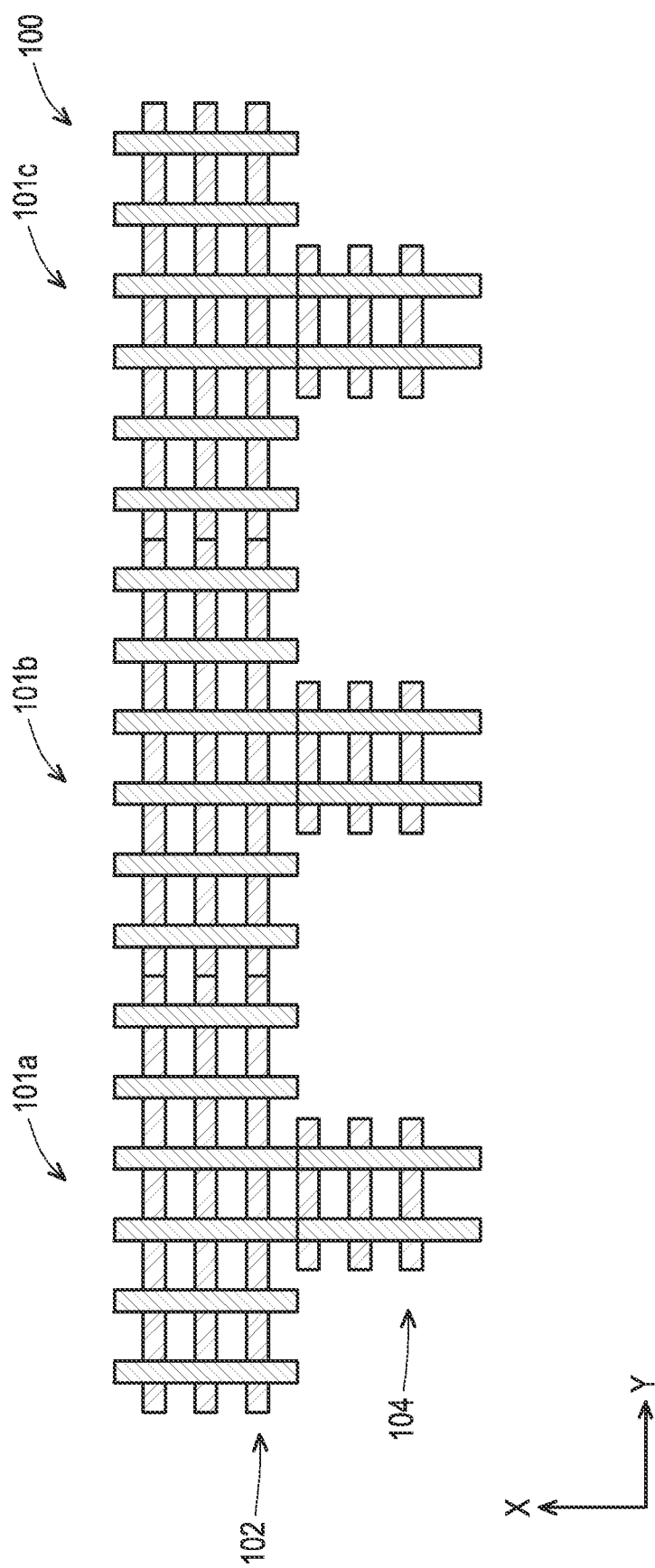
FIG. 24 is a schematic diagram illustrating another multiple resonator cell arrangement for a resonator device in accordance with some embodiments.
Figure 25:
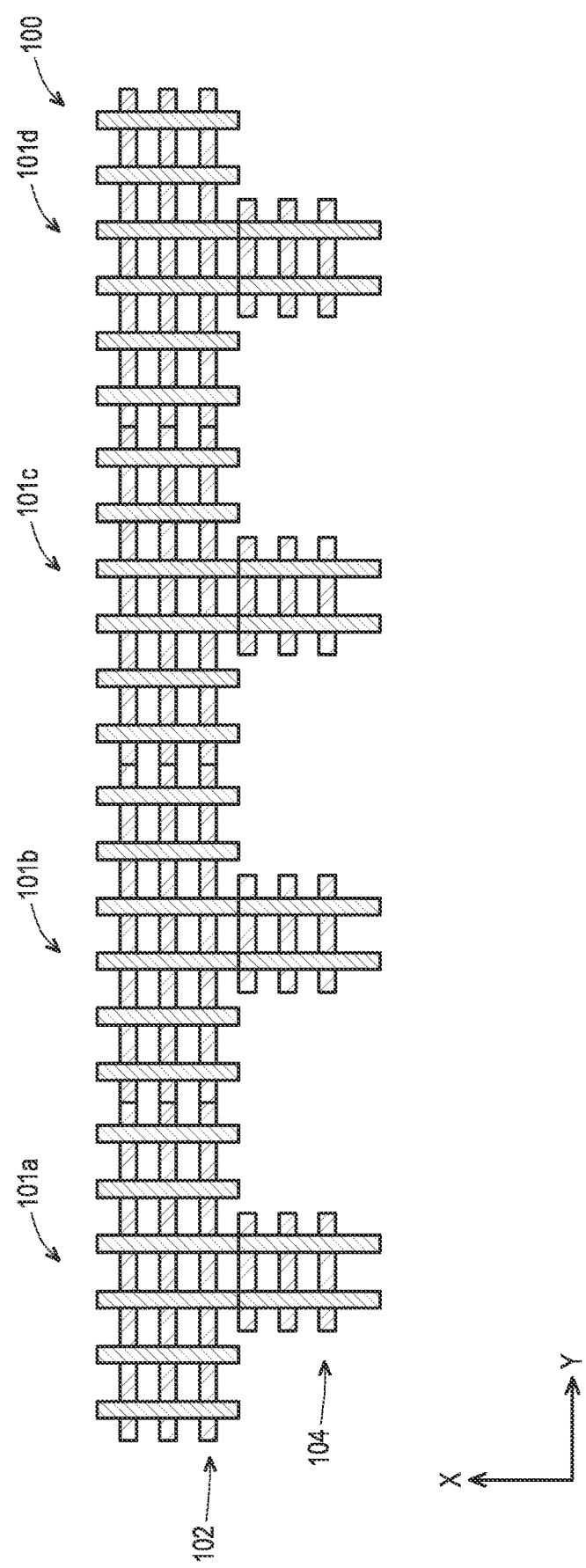
FIG. 25 is a schematic diagram illustrating another multiple resonator cell arrangement for a resonator device in accordance with some embodiments.

FIG. 4 discussed above illustrates a single resonator device 100 that includes the drive region 102 and the sensing region 104. The disclosure is not listed to a single resonator provided for a device. For instance, FIG. 23 illustrates a device 100 that includes two resonator unit cells 101a and 101b. Each of the unit cells 101a, 101b includes a drive region 102 and a sensing region 104, which may be constructed as described hereinabove. FIG. 24 illustrates a device 100 that includes three unit cells 101a, 101b and 101c, while FIG. 25 illustrates yet another example that includes four unit cells 101a, 101b, 101c and 101d. Further examples may include additional unit cells 101. For instance, some examples may include up to 20 unit cells, though the disclosure is not limited to any particular number of unit cells for the resonator 100.

Figure 26:
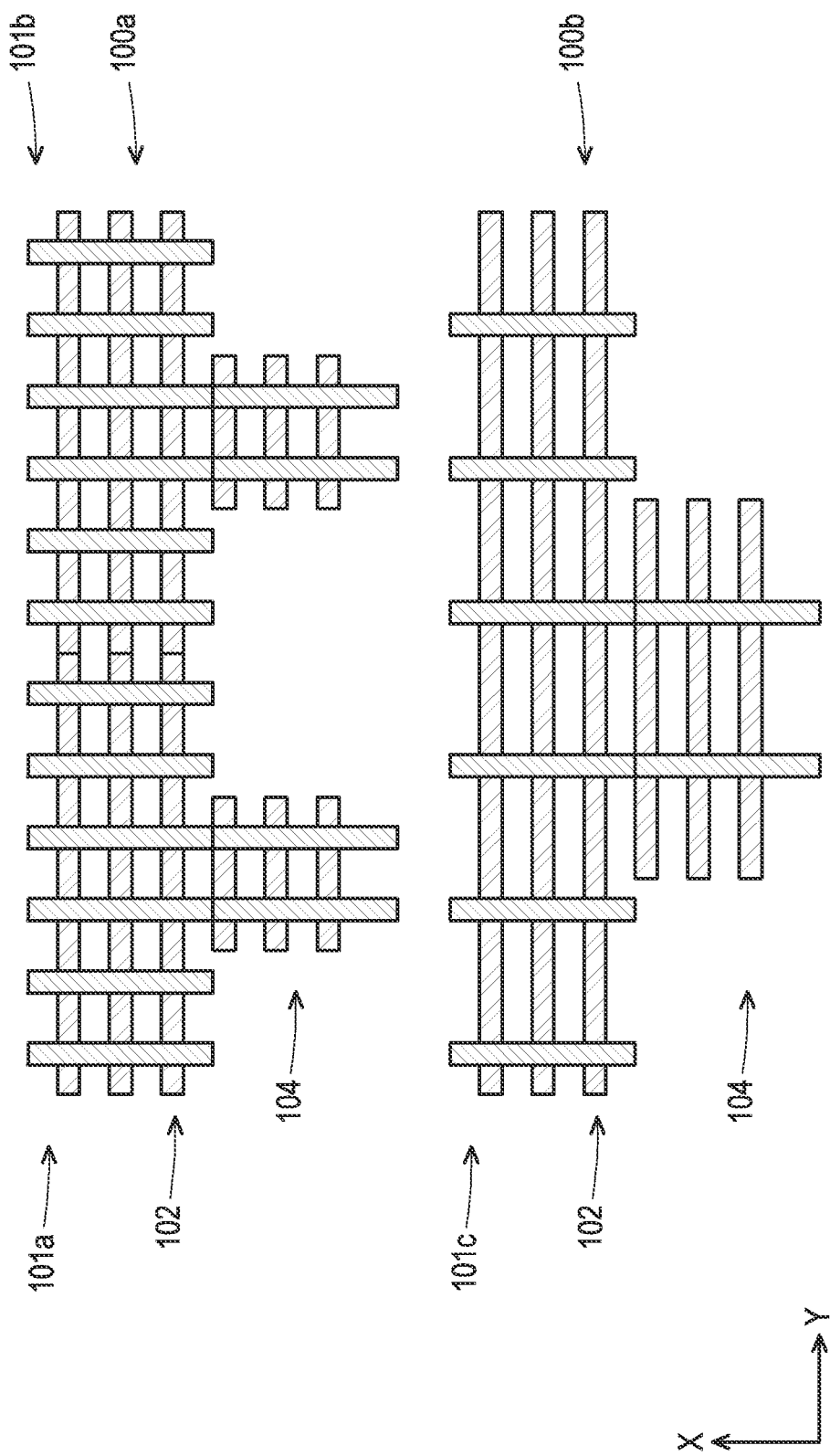
FIG. 26 is a schematic diagram illustrating another multiple resonator cell arrangement for a resonator device in accordance with some embodiments.

In the example shown in FIGS. 23-25, each of the unit cells 101a, 101b, 101c, 101d may define a constant finger pitch. FIG. 26 illustrates yet another example in which two resonator devices 100a and 100b are provided. The first resonator device 100a is similar to that shown in FIG. 23, including two unit cells 101a and 101b that each have a drive region 102 and a sensing region 104. In the example of FIG. 26, each of the unit cells 101a and 101b define a narrow finger pitch, such as the narrow finger pitch 124a shown in FIGS. 17 and 22. The second resonator device 100b has a single unit cell 101c, which also has a drive region 102 and a sensing region 104. The unit cell 101c, however, has a wide finger pitch, such as the wide finger pitch 124b shown in FIGS. 21 and 22.

Figure 27:
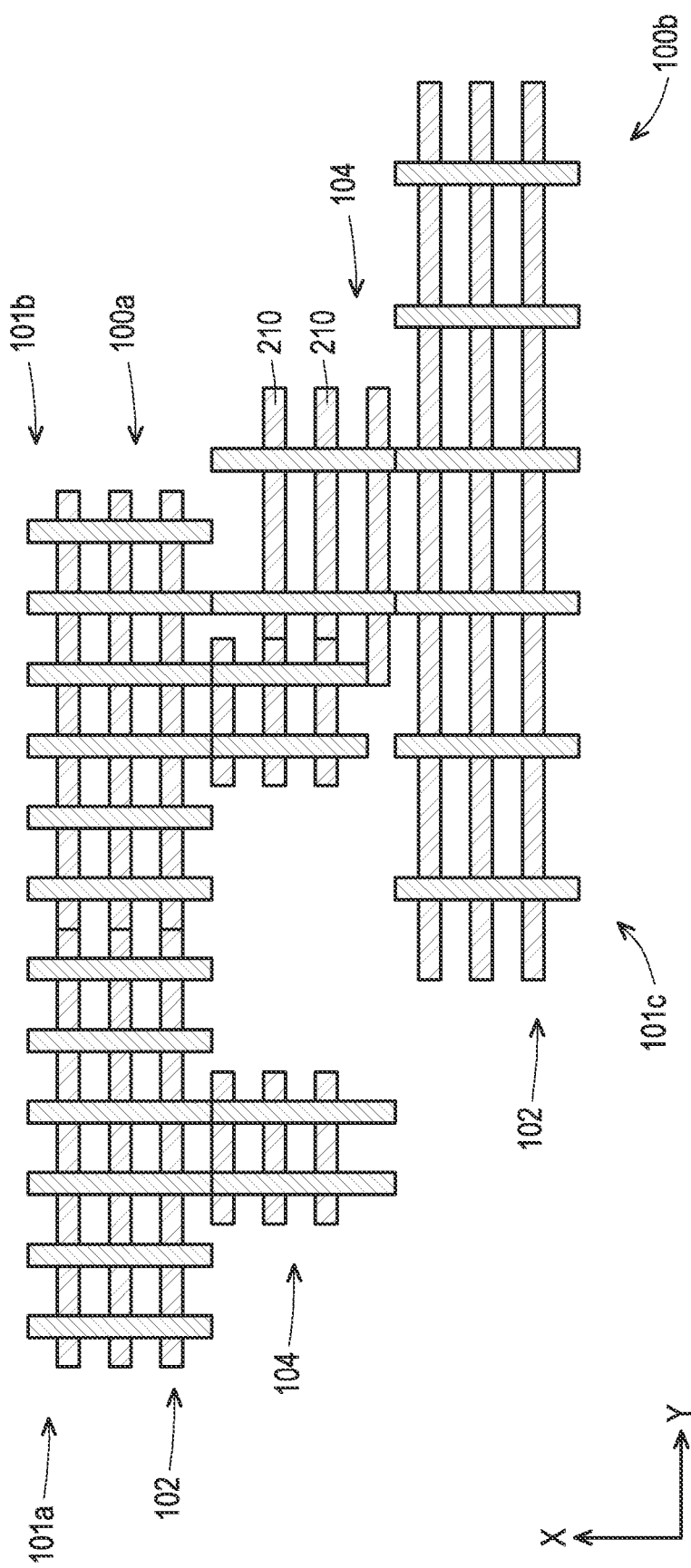
FIG. 27 is a schematic diagram illustrating another multiple resonator cell arrangement for a resonator device in accordance with some embodiments.

Moreover, in the example shown in FIG. 26, both resonator devices 100a and 100b are arranged with their drive regions 102 situated above the sensing regions 104 as shown in the drawing. FIG. 27 illustrates another example, in which the orientation of the resonator unit cells may be varied. As shown in FIG. 27, the first resonator device 100a is arranged as shown in FIG. 26, with its drive region 102 positioned above the sensing region 104. As with the resonator device 100a shown in FIG. 26, the resonator device 100a of FIG. 27 has two unit cells 101a and 101b that each have a drive region 102 positioned above a sensing region 104, and each of the unit cells 101a and 101b defines a narrow finger pitch, such as the narrow finger pitch 124a shown in FIGS. 17 and 22.

In the example of FIG. 27, however, the second resonator device 100b (which has a single unit cell 101c) is inverted. In other words, the sensing region 104 is positioned above the drive region 102 in the resonator device 100b shown in FIG. 27. As shown in FIG. 27, this facilitates sensing transistor structures 200 in the sensing regions 104 of the resonator devices 100a and 100b to have some common fins 210, potentially resulting in a smaller device. Further, the unit cell 101c has a wide finger pitch, such as the wide finger pitch 124b shown in FIGS. 21 and 22.

Figure 28:
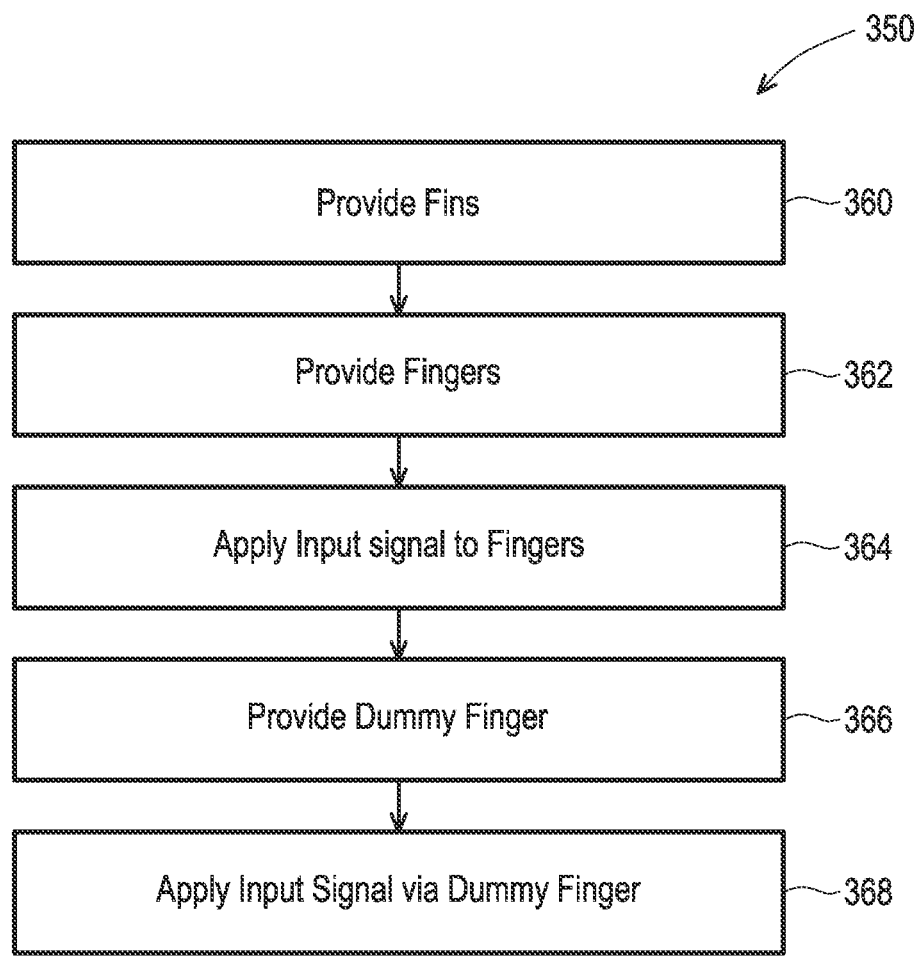
FIG. 28 is a flow diagram illustrating an example resonator method in accordance with some embodiments.

FIG. 28 is a flow diagram illustrating an example of a resonator method 350 in accordance with the present disclosure. Referring to FIG. 28 in conjunction with Figures discussed above, at an operation 360 a plurality of semiconductor fins 110 are provided that extend in a first direction X. A plurality of conductive drive fingers 120 are provided over the fins 110, which extend in a second direction Y. The fins 110 and fingers 120 are components of the drive region 102 of the example resonator devices 100 discussed above. At operation 364, an input signal, such as the +Vdrive, −Vdrive, +½vdrive, and −½vdrive input signals, is applied to the plurality of conductive drive fingers 120. A dummy finger 122 is further provided over the fins, which extends in the second direction as indicated at operation 366. At operation 368, the drive signal is applied from the conductive drive fingers 120 to a gate 220 of a sensing transistor 200 via the dummy finger 122. As discussed above, a first polarity input signal +Vdrive may be applied to a first one of the conductive drive fingers 120+ while a second polarity input signal −Vdrive may be applied to a second one of the conductive drive fingers 120+. In some examples, the number of semiconductor fins is less than or equal to the number of conductive drive fingers (i.e. fins≤fingers). As noted above, the resonator output frequency is tunable by varying the finger pitch 124 of the conductive drive fingers 120.

Thus, with some aspects of the present disclosure, a resonator device includes a substrate with a first number of fins extending over the substrate. The fins extend along the substrate in a first direction (i.e. X direction). A second number of conductive fingers are provided over the fins, which extend in a second direction perpendicular to the first direction (i.e. Y direction). The first number is less than or equal to the second number. The conductive fingers are configured to receive an input signal such that the conductive fingers resonate at an output frequency. The conductive fingers are spaced apart from on another based on a predetermined finger pitch, and the output frequency is based on the finger pitch.

In accordance with further aspects of the disclosure, a resonator device has a drive region that includes a plurality of fins extending parallel to one another in a first direction (i.e. X direction). The fins are spaced apart from one another in a second direction perpendicular to the first direction (i.e. Y direction). A plurality of dielectric structures are situated in gaps formed between adjacent ones of the drive fins, and a plurality of conductive drive fingers are over the fins. The conductive drive fingers extend in the second direction and are connected to receive a periodic input signal. The drive region includes a dummy finger that is not connected to receive the periodic input signal. A sense region includes a sense transistor having a source, a drain and a gate. The gate is connected to the dummy finger.

In accordance with still further aspects of the present disclosure, a method of forming a resonator includes forming a plurality of semiconductor fins extending in first direction (i.e. X direction) over a substrate and a plurality of conductive drive fingers over the fins extending in a second direction (i.e. Y direction). A dummy finger is formed over the fins that extends in the second direction. A voltage input terminal configured to receive a drive signal is connected to the plurality of conductive drive fingers, and the dummy finger is connected to an output terminal configured to output a sense current.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a substrate;

a first number of fins over the substrate, the fins extending along the substrate in a first direction, wherein the fins do not have source/drain epitaxial thereon;

a second number of conductive fingers over the fins, the conductive fingers extending in a second direction perpendicular to the first direction, the first number being less than or equal to the second number, the conductive fingers configured to receive an input signal such that the conductive fingers resonate at an output frequency; and wherein the conductive fingers are spaced apart from one another based on a predetermined finger pitch.

2. The device of claim 1, further comprising:

a dummy conductive finger extending in the second direction that is not configured to receive the input signal; and a sense transistor having a gate connected to the dummy conductive finger.

3. The device of claim 2, wherein the sense transistor comprises:

a sense fin extending along the substrate in the first direction, the fin including a source node and a drain node and a channel between the source and drain nodes;

a conductive gate strip over the sense fin extending in the second direction.

4. The device of claim 3, wherein the dummy conductive finger forms the conductive gate strip on the sense fin.

5. The device of claim 1, wherein the fins have a fin height and the fingers have a finger height that is greater than the fin height.

6. The device of claim 1, further comprising a plurality of dielectric structures situated in respective gaps formed between the fins.

7. The device of claim 1, wherein the conductive fingers each include a conductive gate strip and a plurality of metal layers over and electrically connected to the conductive gate strip.

8. A device, comprising:

a drive region including:

a plurality of fins extending parallel to one another in a first direction, wherein the fins are spaced apart from one another in a second direction perpendicular to the first direction;

a plurality of dielectric structures situated in gaps formed between adjacent ones of the fins;

a plurality of conductive drive fingers over the fins, the conductive drive fingers extending in the second direction and connected to receive a periodic input signal;

a dummy finger that is not connected to receive the periodic input signal; and a sense region including:

a sense transistor having a source, a drain and a gate, the gate connected to the dummy finger.

9. The device of claim 8, wherein the conductive drive fingers each include a conductive gate strip and a plurality of metal layers over and electrically connected to the conductive gate strip.

10. The device of claim 8, wherein the conductive drive fingers are spaced apart based on a predetermined finger pitch therebetween.

11. The device of claim 8, wherein there are more of the conductive drive fingers than the fins.

12. The device of claim 8, further comprising:

first and second sense transistors including the sense transistor, the first and second sense transistors including a fin extending in the first direction and having respective first and second source/drain nodes of the first and second sense transistors; and first and second dummy fingers including the dummy finger, the first and second dummy fingers forming respective first and second gate terminals of the first and second sense transistors.

13. The device of claim 12, wherein the first and second dummy fingers are adjacent one another.

14. The device of claim 8, wherein the fins do not have source/drain epitaxial thereon.

15. The device of claim 8, wherein the periodic drive signal is an RF drive signal, and wherein the gate of the sense transistor is configured to provide an output signal from the dummy finger based on the RF drive signal.

16. The device of claim 8, wherein the drive region includes a first group of the plurality of fins spaced apart from one another based on a first predetermined finger pitch, and a second group of the plurality of fins spaced apart from one another based on a second predetermined finger pitch different from the first predetermined finger pitch.

17. A method, comprising:

forming a plurality of semiconductor fins extending in first direction over a substrate;

forming a plurality of conductive drive fingers extending in a second direction over the fins;

forming a dummy finger extending in the second direction over the fins;

connecting a voltage input terminal configured to receive a drive signal to the plurality of conductive drive fingers; and connecting the dummy finger to an output terminal configured to output a sense current.

18. The method of claim 17, wherein connecting the voltage input terminal includes connecting a first voltage input terminal to a first one of the conductive drive fingers, the first voltage input terminal being configured to receive a first polarity input signal, and connecting a second voltage input terminal to a second one of the conductive drive fingers, the first voltage input terminal being configured to receive a second polarity input signal.

19. The method of claim 17, wherein forming the plurality of conductive drive fingers includes spacing apart the plurality of conductive drive fingers in the second direction based on a predetermined finger pitch.

20. The method of claim 19, the predetermined finger pitch is based on a desired output frequency of the sense current.

* * * * *